(12) United States Patent
Wiegand et al.

(10) Patent No.: US 11,430,944 B2
(45) Date of Patent: Aug. 30, 2022

(54) INTERCONNECT STRUCTURES FOR LOGIC AND MEMORY DEVICES AND METHODS OF FABRICATION

(71) Applicant: Intel Corporation, Santa Clara, CA (US)

(72) Inventors: Christopher Wiegand, Portland, OR (US); Gokul Malyavanatham, Hillsboro, OR (US); Oleg Golonzka, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 649 days.

(21) Appl. No.: 16/358,671

(22) Filed: Mar. 19, 2019

(65) Prior Publication Data

US 2020/0303623 A1    Sep. 24, 2020

(51) Int. Cl.
| | |
|---|---|
| H01L 43/02 | (2006.01) |
| H01L 27/24 | (2006.01) |
| H01L 27/22 | (2006.01) |
| H01L 45/00 | (2006.01) |
| H01L 43/12 | (2006.01) |

(52) U.S. Cl.
CPC ............ *H01L 43/02* (2013.01); *H01L 27/228* (2013.01); *H01L 27/2436* (2013.01); *H01L 43/12* (2013.01); *H01L 45/08* (2013.01); *H01L 45/1253* (2013.01); *H01L 45/1675* (2013.01)

(58) Field of Classification Search
CPC ..................................................... H01L 27/228
See application file for complete search history.

(56) References Cited

U.S. PATENT DOCUMENTS

| | | | |
|---|---|---|---|
| 2020/0343301 A1* | 10/2020 | Buford | .................... H01L 43/04 |
| 2021/0159270 A1* | 5/2021 | Reznicek | ................ H01L 43/12 |
| 2022/0013582 A1* | 1/2022 | Chen | ....................... H01L 27/24 |

\* cited by examiner

*Primary Examiner* — Mounir S Amer
(74) *Attorney, Agent, or Firm* — Finch & Maloney PLLC

(57) ABSTRACT

An apparatus includes a first interconnect structure above a substrate, a memory device above and coupled with the first interconnect structure in a memory region. The memory device includes a non-volatile memory element, an electrode on the non-volatile memory element, and a metallization structure on a portion of the electrode. The apparatus further includes a second interconnect structure in a logic region above the substrate, where the second interconnect structure is laterally distant from the first interconnect structure. The logic region further includes a second metallization structure coupled to the second interconnect structure and a conductive structure between the second metallization structure and the second interconnect structure. The apparatus further includes a dielectric spacer that extends from the memory device to the conductive structure.

20 Claims, 19 Drawing Sheets

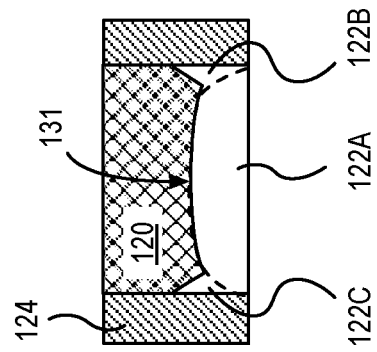
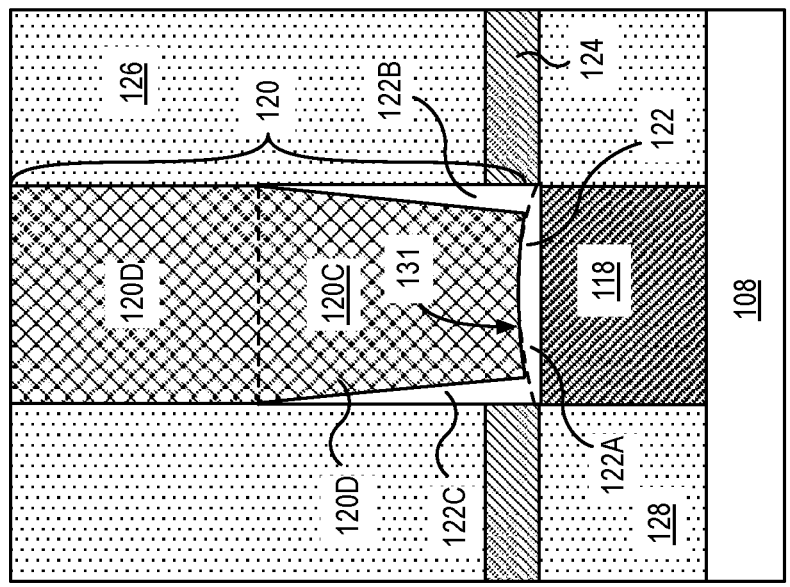
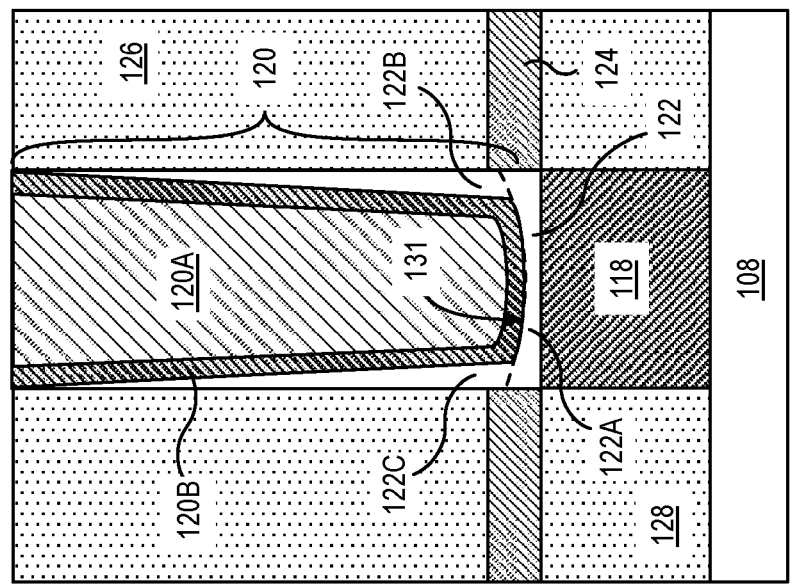
FIG. 2C
FIG. 2B
FIG. 2A

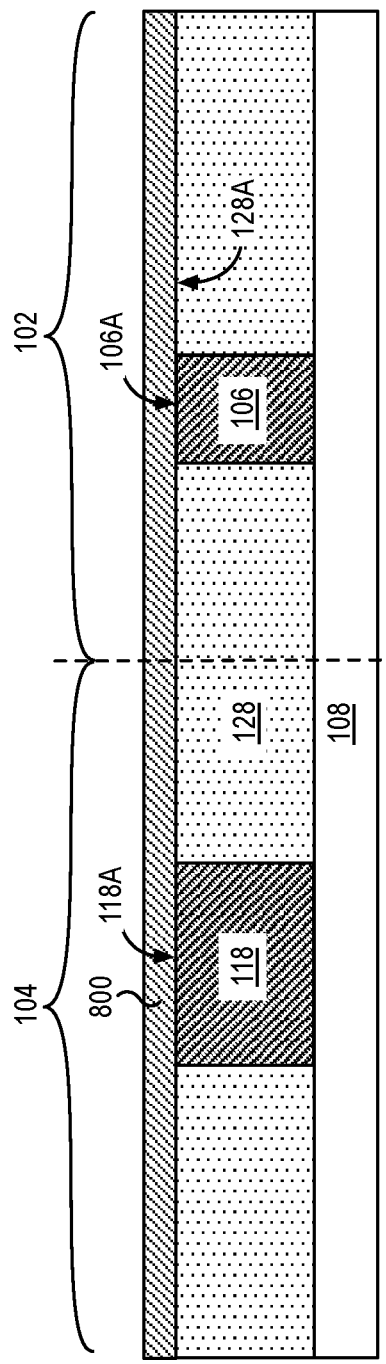
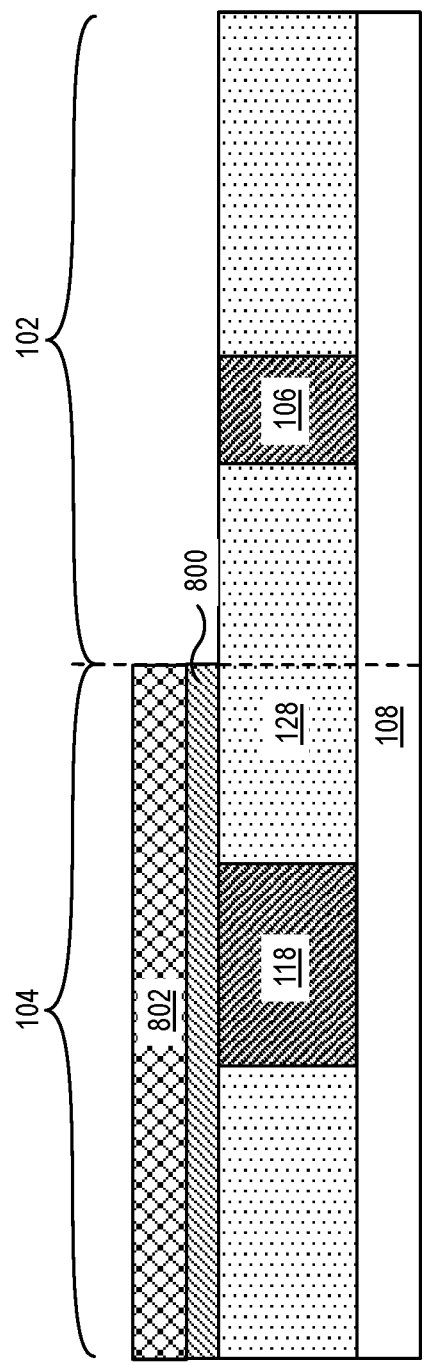
FIG. 8A
FIG. 8B

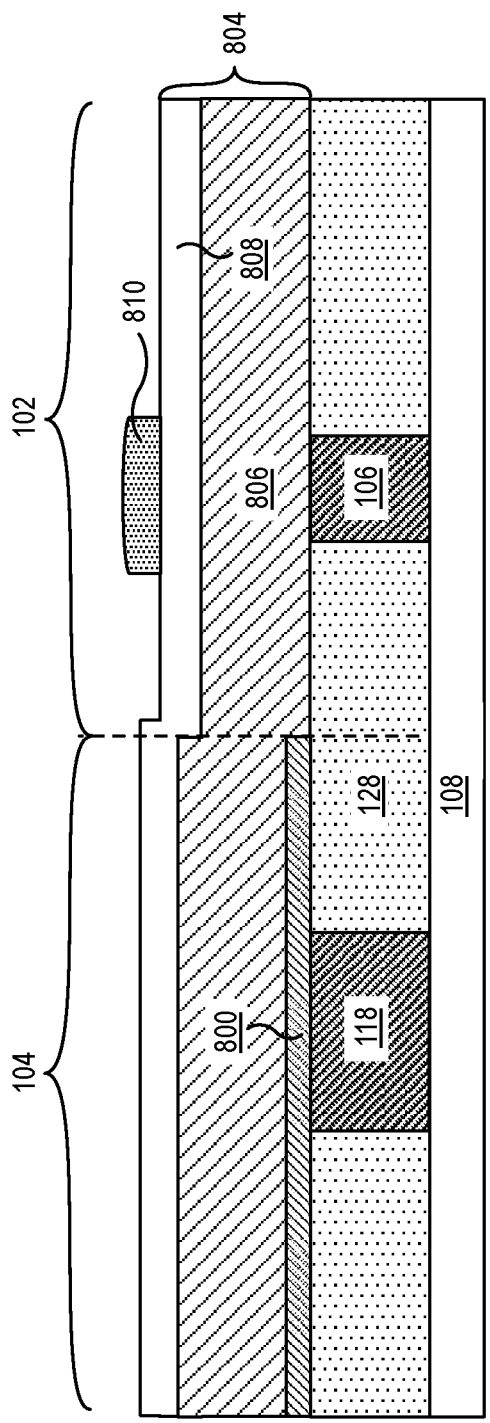
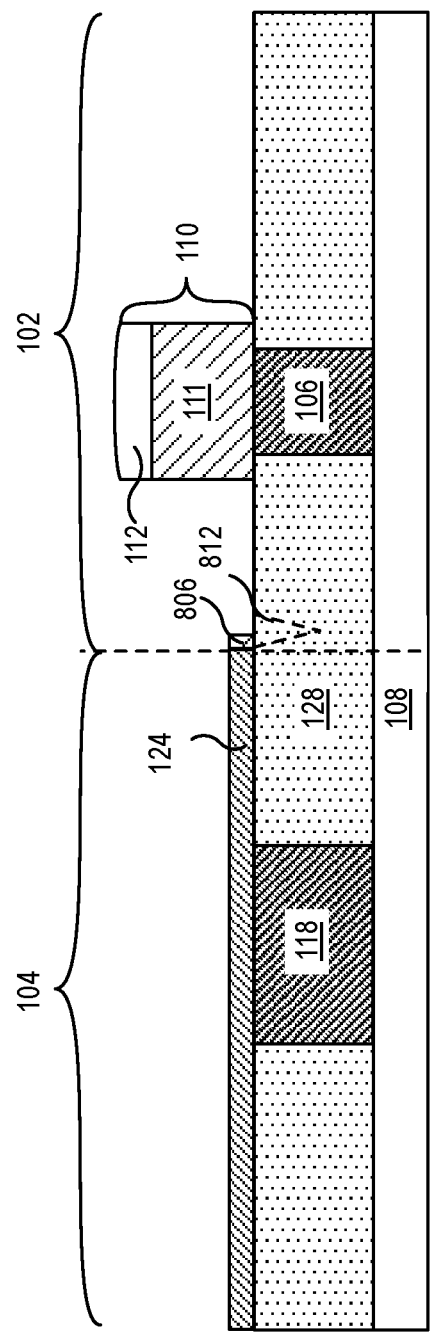
FIG. 8C
FIG. 8D

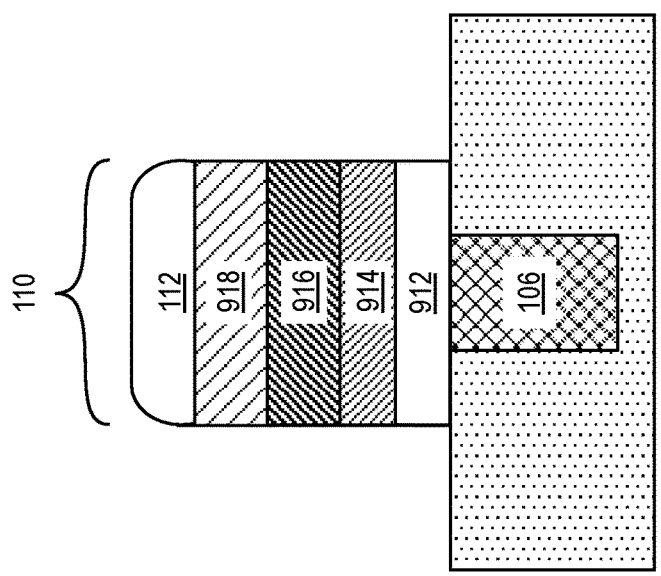
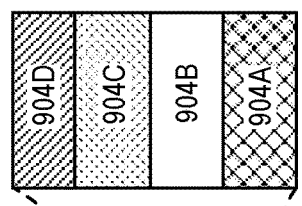
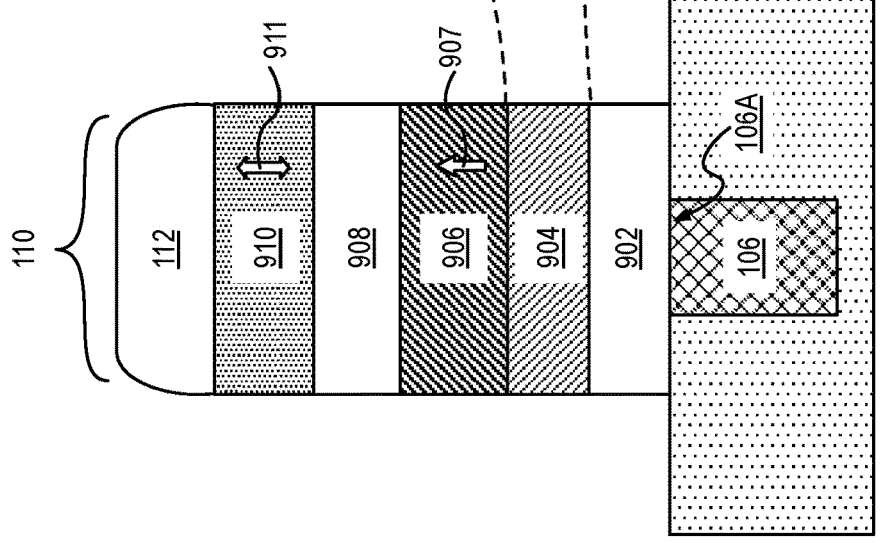
FIG. 9A
FIG. 9B
FIG. 9C

INTERCONNECT STRUCTURES FOR LOGIC AND MEMORY DEVICES AND METHODS OF FABRICATION

BACKGROUND

For the past several decades, feature size reduction has been an important focus for industrial-scale semiconductor process development. Scaling to smaller dimensions enables a higher density of functional elements per chip, smaller chips, and also reduced cost. However, as the industry approaches the physical limits of traditional scaling, it is becoming increasingly important to look for non-traditional types of devices that can offer new functionality. Some examples are non-volatile memory devices such as perpendicular magnetic random-access memory (MRAM) devices based on magnetic tunnel junctions (MTJ) and metal-oxide based resistive-random access memory devices.

Embedded non-volatile memory can offer improved energy and computational efficiency. However, it is a formidable technical challenge to assemble high-yielding non-volatile memory arrays that are fully integrated with the surrounding logic circuitry using interconnect and metallization structures.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 2A illustrates a cross-sectional view of the second metallization structure coupled with the interconnect structure in a logic region, and an intervening conductive structure between the second metallization structure and the interconnect structure, in accordance with an embodiment of the present disclosure.

FIG. 2B illustrates a cross-sectional view of the second metallization structure coupled with the interconnect structure in a logic region, and an intervening conductive structure between the second metallization structure and the interconnect structure, where the intervening conductive structure is partially adjacent to a sidewall of the second metallization structure, in accordance with an embodiment of the present disclosure.

FIG. 2C illustrates a cross-sectional view of the second metallization structure coupled with the interconnect structure in a logic region, and an intervening conductive structure between the second metallization structure and the interconnect structure, in accordance with an embodiment of the present disclosure.

FIG. 8A illustrates a cross-sectional view following the formation of a first interconnect structure in a memory region and a second interconnect structure in a logic region in a first dielectric above a substrate and following the formation of a second dielectric on the first dielectric.

FIG. 8B illustrates a cross-sectional view of the structure in FIG. 8A following the formation of a mask and following the process to pattern the second dielectric.

FIG. 8C illustrates a cross-sectional view of the structure in FIG. 8B following the formation of a material layer stack for the formation of an NVM device.

FIG. 8D illustrates a cross-sectional view of the structure in FIG. 8C following the patterning of the material layer stack to form a memory device including an NVM memory element and an electrode on the NVM memory device.

FIG. 9A illustrates a cross sectional view of a magnetic tunnel junction memory device, in accordance with an embodiment of the present disclosure.

FIG. 9B illustrates a cross sectional view of a synthetic antiferromagnet structure, in accordance with an embodiment of the present disclosure.

FIG. 9C illustrates a cross sectional view of a resistive random-access memory device, in accordance with an embodiment of the present disclosure.

DESCRIPTION OF THE EMBODIMENTS

Figures 1A, 1B:
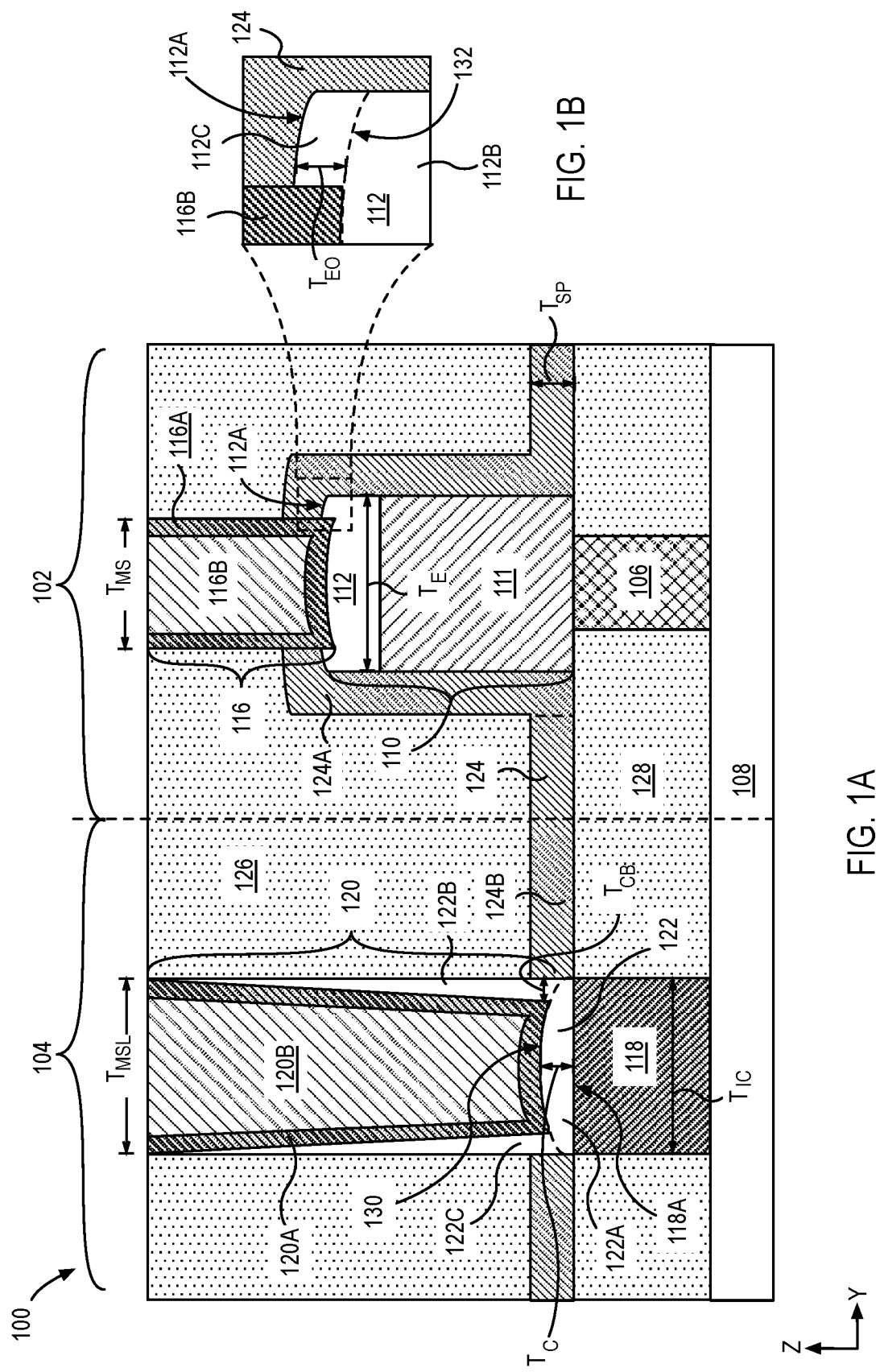
FIG. 1A illustrates a cross-sectional view of a memory device coupled with a first metallization structure in a memory region and a second metallization structure coupled with an interconnect structure in a logic region, in accordance with an embodiment of the present disclosure.
FIG. 1B illustrates an enhanced cross-sectional view of a portion of an electrode of a memory device, where the portion of the electrode is coupled with the first metallization structure, in accordance with an embodiment of the present disclosure.

Interconnect structures for logic and memory device and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

An array of non-volatile memory (NVM) devices may be formed along-side logic circuitry on a substrate. The non-volatile memory (NVM) devices may be formed in a memory region of a substrate and the logic circuitry may be formed in an adjacent logic region. In some examples, the NVM devices may be formed adjacent to regions of copper interconnects in a logic region. Copper interconnects are used in integrated circuits because of properties such as low electrical resistance and relative ease of fabrication. For electrical connectivity, a top portion of an NVM device in the memory region and an adjacent copper interconnect in the logic region may be each coupled to separate metallization structures. For example, a first metallization structure may be formed in a first opening in a dielectric above the NVM device and a second metallization structure may be formed in a second opening in the dielectric above the copper interconnect in the logic region. For process efficiency and to obtain alignment accuracy the first and second openings may be formed at the same time. When the first and second openings are formed a top portion of NVM device and a top portion of the copper interconnect may be simultaneously exposed.

In some cases, a top portion of the NVM device has an electrode structure that may include metals which may become oxidized during a fabrication process. The electrode structure can become oxidized due to one or more breaks in vacuum between various process operations of the fabrication process. In some examples the electrode structure may be exposed to one or more processes including plasma etch, wet chemical etch and/or chemical mechanical polish (CMP). For robust electrical connectivity it is desirable to remove portions of the electrode structure that have become oxidized before formation of a metallization structure on the NVM device. Oxidized portions of the patterned electrodes may be removed, for example, using a sputter-based process. However, such a sputtering process can redistribute copper from an adjacent copper interconnect onto sidewalls of the second opening in the dielectric material. Sputtered copper may lead to copper migration during the fabrication process. Copper migration is a problem in semi-conductor device fabrication which leads to electrical failures in devices. For mitigating problems arising from copper migration it is highly desirable to prevent copper atoms from being sputtered on to sidewalls of the second opening while removing oxidized portions of the electrode structure of the NVM device.

The inventors have found that by selectively forming a conductive layer on the copper interconnect with respect to electrode structure, redistribution of copper during the sputter process may be prevented. The conductive layer formed on the copper interconnect may seal the copper interconnect and offer protection during the sputter clean process. Depending on the composition of the conductive layer, portions of the conductive layer may be removed and redistributed onto sidewalls of the second opening during the sputter clean process. The conductive layer may be formed to a thickness that does not expose the copper interconnect in spite of the sputtering and potential redistribution.

The conductive layer may be chosen to include materials that do not experience migration, like copper, during the fabrication process. In some embodiments, portions of the conductive layer may combine with a material of the dielectric in the second opening. However, the portion of the conductive layer that remains on the copper interconnect may be sufficiently conductive so as to not increase electrical resistance between the copper interconnect and a metallization structure that is subsequently formed above.

FIG. 1A illustrates a cross-sectional view of an apparatus 100 including a memory region 102 and a logic region 104. The memory region 102 includes an interconnect structure 106 above a substrate 108, a memory device 110 above and coupled with the interconnect structure 106. The memory device 110 includes a non-volatile memory element 111, an electrode 112 on the non-volatile memory element 111, and a metallization structure 116 on a portion of the electrode 112. The apparatus 100 further includes an interconnect structure 118 in the logic region 104 above the substrate 108, where the interconnect structure 118 is laterally distant from the interconnect structure 106. The logic region 104 further includes a metallization structure 120 coupled to the interconnect structure 118 and a conductive structure 122 between the metallization structure 120 and the interconnect structure 118. The apparatus 100 further includes a dielectric spacer 124 that extends from the memory device 110 to the conductive structure 122. The dielectric spacer has a portion 124A adjacent to the memory device 110 and a portion 124B adjacent to the conductive structure 122. The apparatus 100 further includes a dielectric 126 on the dielectric spacer 124, between the memory device 110 and metallization structure 120. A dielectric 128 is between the substrate 108 and the dielectric spacer 124 and between the interconnect structure 106 and interconnect structure 118.

The conductive structure 122 may have a shape that is indicative of a processing technique during a fabrication process. In the cross-sectional illustration, the conductive structure 122 has a conductive structure portion 122A, a conductive structure portion 122B and a conductive structure portion 122C opposite to structure portion 122A, where portions 122A, 122B and 122C are contiguous. As shown, conductive structure portion 122A is directly in contact and in between the interconnect structure 118 and the metallization structure 120. In an embodiment, the conductive structure portion 122A has a concave down shape, as shown. The concave down shape may or may not be symmetrical about a vertical central axis (Z-axis in FIG. 1A) through the conductive structure portion 122A. The conductive structure portion 122A has a thickness, $T_C$, as measured vertically upward from an uppermost surface 118A of the interconnect structure 118. In an embodiment, when the conductive structure portion 122A has a concave down shape as is shown, $T_C$ is not uniform and is between 1 nm and 3 nm between the thickest and thinnest portions. In an embodiment, when the conductive structure portion 122A has a concave down shape as is shown, the conductive structure portion 122A has maximum thickness, $T_C$ that is between 2 nm and 10 nm. Maximum thickness $T_C$ may not be at a center of the conductive structure portion 122A. In the illustrative embodiment, a maximum thickness $T_C$ is approximately at a center (along the Y-axis) of the conductive structure portion 122A.

In an embodiment, the conductive structure portion 122B is adjacent to dielectric 126 and to metallization structure 120. As shown, the conductive structure portion 122B is between dielectric 126 and metallization structure 120. The conductive structure portion 122B may have a shape that is wide at a base (adjacent to conductive structure portion 122A) and narrow upward from the base. The conductive structure portion 122B has a thickness $T_{CB}$. In embodiments, $T_{CB}$ ranges between 1 nm to 3 nm at the base. In embodiments, $T_{CB}$ ranges between 1 nm to 3 nm at the base to 0.5 nm to 1 nm at a thinnest section vertically (along Z-axis) from the base. In the illustrative embodiment, conductive structure portion 122 extends along an entire vertical extent (along Z-axis) of the metallization structure 120. In an embodiment, the conductive structure portion 122C has one or more of the features of the conductive structure portion 122B such as shape, thickness and vertical extent.

In other embodiments the conductive structure portion 122A has a concave down shape (negative Z axis), as shown in FIG. 2A. In such an embodiment, the conductive structure portion 122A has a maximum thickness in the vicinity of the conductive structure portions 122B and 122C that is away from a central axis. In an embodiment, the conductive structure portion 122A has a minimum thickness, TCMIN that is at least 1 nm.

In an embodiment, the conductive structure 122 includes one or more of ruthenium, titanium or tantalum. In an embodiment, conductive structure 122 has portions that include trace amounts of oxygen. Trace amounts of oxygen may be distributed throughout the conductive structure or be concentrated adjacent to the dielectric 126.

Referring again to FIG. 1A, the metallization structure 120 may include a single material or a plurality of layers. In the illustrative embodiment, metallization structure 120 includes a liner layer 120A and a fill metal 120B adjacent to liner layer 120A. In an embodiment, the liner layer 120A includes ruthenium, cobalt or tantalum and the fill metal 120B includes copper or tungsten.

The liner layer 120A is adjacent to the conductive structure 122. As shown, the liner layer 120B has a lower most surface 130 that follows a shape of the conductive structure portion 122A. Liner layer 120A provides an adhesion as well as a migration barrier for the fill metal 120B. In an embodiment, the liner layer 120A has a thickness that is between 1 nm and 5 nm. In other embodiments, when the conductive structure portion 122A has a top surface 130 having peaks and troughs (not shown), the liner layer 120A may not conformal with conductive structure portion 122A.

In an embodiment, the metallization structure 120 has a first portion 120C and a second portion 120D such as is illustrated in FIG. 2B. The liner layer and the fill metal are not shown separately in FIG. 2B to provide clarity. In the illustrative embodiment, conductive structure portions 122B and 122C do not extend vertically along an entire vertical extent (Z-direction) of the metallization structure 120. In such an embodiment, a metallization structure portion 120C is adjacent to the conductive structure portions 122A, 122B and 122C of the conductive structure 122 and metallization structure portion 120C is directly adjacent and in contact with the dielectric 126.

In other embodiments, the conductive structure portions 122B and 122C each have a short vertical extent (Z direction) above a top surface 131 of conductive structure portion 122A, as shown in FIG. 2C. The conductive structure portions 122B and 122C may extend vertically (in Z direction) between 1 nm-3 nm above top surface 131 of conductive structure portion 122A, as shown. In such embodiments, a section of the metallization structure 120 is adjacent to dielectric spacer 124.

Figure 2D:
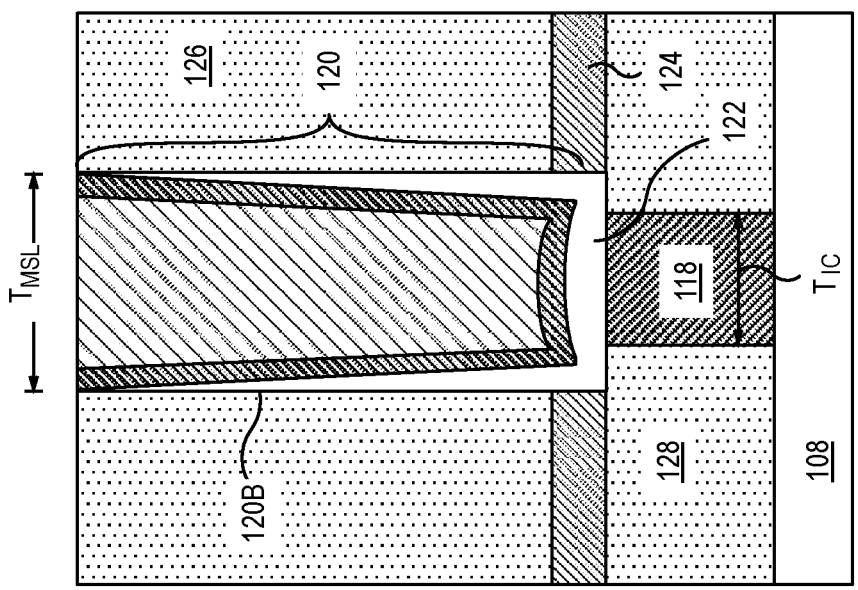
FIG. 2D illustrates a cross-sectional view of the second metallization structure coupled with the interconnect structure in a logic region, where the second metallization structure has a larger lateral dimension compared to a lateral dimension of the interconnect structure in a logic region, in accordance with an embodiment of the present disclosure.

Referring again to the logic region in FIG. 1A, the metallization structure 120 has a lateral thickness, $T_{MSL}$, that is substantially the same as a lateral thickness, $T_E$, of the electrode 112. In an embodiment, $T_{MSL}$ is greater than $T_E$ such as is illustrated in FIG. 2D. In some such embodiments, conductive layer 122 has portions that are adjacent to dielectric 128.

Referring again to the memory region 102 in FIG. 1A, the metallization structure 116 is directly on the electrode 112, without an intervening structure such as the conductive structure 122. In an embodiment, the metallization structure 116 extends into a portion of electrode 112 below a top surface 112A, as shown. Depending on embodiments, metallization structure 116 may extend between 1 nm and 3 nm into the electrode 112 below the top surface 112A.

The metallization structure 116 may include a single material or a plurality of layers. In the illustrative embodiment, metallization structure 116 includes a liner layer 116A and a fill metal 116B. In an embodiment, the liner layer 116A includes ruthenium, cobalt or tantalum and the fill metal 116B includes copper or tungsten.

FIG. 1B is an enhanced cross-sectional illustration of a portion of the electrode 112 and the metallization structure 116. In an embodiment, the electrode 112 includes a first electrode portion 112B and a second electrode portion 112C in contact with the first electrode portion 112B. The composition of the electrode 112 may differ between the electrode portions 112B and 112C, for example, the electrode portion 112B may include a metal and electrode portion 112C may include the metal and oxygen. In an embodiment, the electrode 112 includes tantalum or tantalum nitride. In one example, the electrode portion 112B includes tantalum and 112C includes tantalum and oxygen. In another example, the electrode portion 112B includes tantalum nitride and 112C includes tantalum nitride and oxygen.

An approximate boundary between the electrode portion 112B and electrode portion 112C is indicated by dashed line 132. Depending on fabrication techniques the electrode portion 112C may have a thickness, $T_{EO}$, between 1 nm and 5 nm.

As shown in FIG. 1B, the metallization structure 116 extends below the top surface 112A and is in contact with electrode portion 112B. In other embodiments, the metallization structure 116 extends below the top surface 112A and into a section of the electrode portion 112B below the dashed line 132. In some such embodiments, electrical resistance between the metallization structure 116 and the electrode 112 may be reduced compared to when the metallization structure 116 extends to the dashed line 132.

Figure 3:
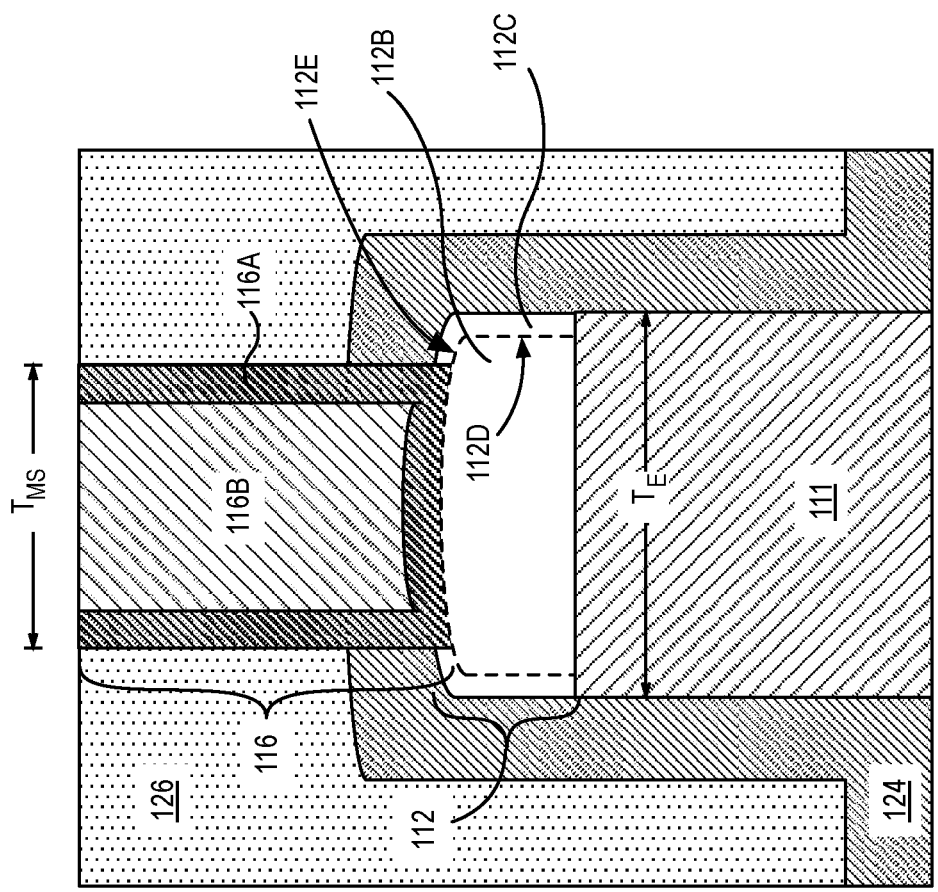
FIG. 3 illustrates a cross-sectional view of the first metallization structure coupled with an electrode of a memory device, where the electrode has a first portion and a second portion in contact with the first portion, in accordance with an embodiment of the present disclosure.

In the illustrative embodiment, the electrode portion 112C is confined to a top portion of the electrode 112. In other embodiments, a section of the electrode portion 112C extends along a sidewall 112D (dashed line) of the first electrode portion 112B as illustrated in FIG. 3. In some embodiments, the electrode portion 112C has a uniform thickness as measured from the sidewall 112D. In other embodiments, a top section of the electrode portion 112C, adjacent to top surface 112E, has a thickness that is greater than a thickness of the section of electrode portion 112C adjacent to sidewall 112D. Such variations in thickness in electrode portion 112C may arise due to preferential damage of a top section of electrode 112 during a fabrication process.

Figure 4:
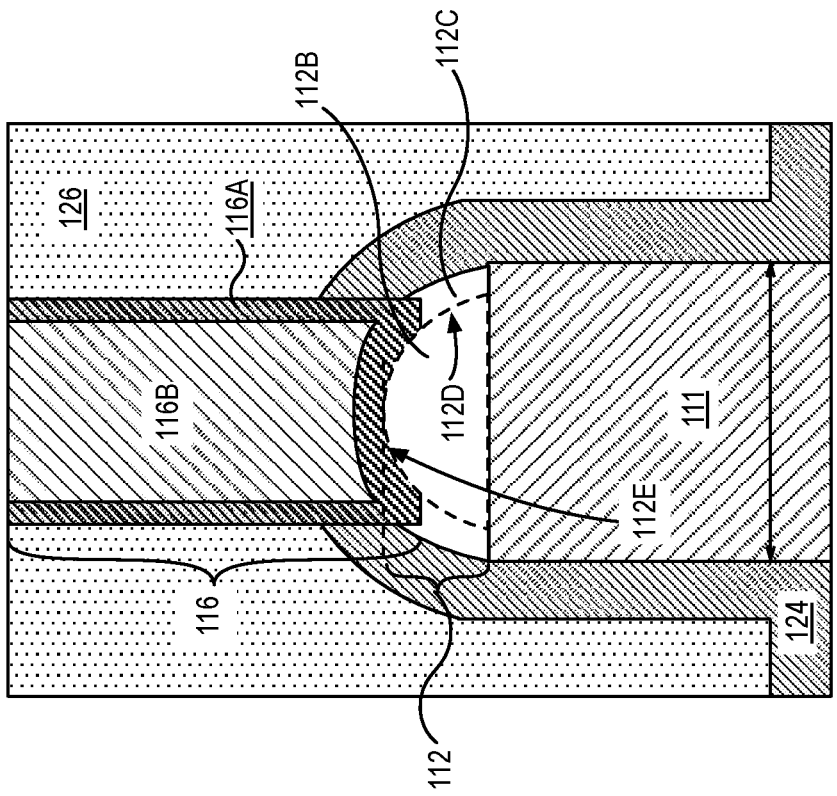
FIG. 4 illustrates a cross-sectional view of the first metallization structure coupled with a hemispherical shaped electrode of a memory device, where the hemispherical shaped electrode has a first portion and a second portion.

In another embodiment, the electrode 112 has a hemispherical shape as shown in FIG. 4. In some such embodiment, an electrode 112 having a hemispherical shape has one or more features of the electrode 112 described in association with FIG. 3. In the illustrative embodiment, the electrode 112 has an electrode portion 112B with a hemispherical shape and electrode portion 112C that is substantially conformal to electrode sidewall 112D. In an embodiment, the electrode portion 112C has a thickness as measured from the surface 112E that is substantially uniform.

Figure 5:
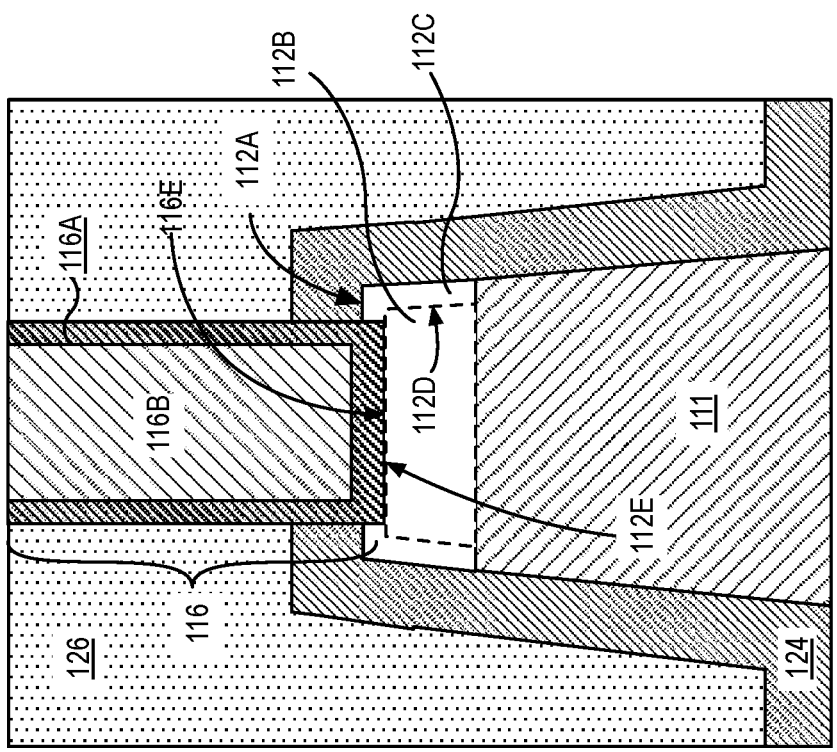
FIG. 5 illustrates a cross-sectional view of the first metallization structure coupled with a trapezoidal shaped electrode of a memory device, where the trapezoidal shaped electrode has a first portion and a second portion.

FIG. 5 illustrates an embodiment in which the electrode 112 has a substantially planar surface uppermost surface 112A. In some such embodiment, electrode 112 has one or more features of electrode 112 described in association with FIG. 3. In the illustrative embodiment, electrode 112 has an electrode portion 112B with a trapezoidal shape and electrode portion 112C that is substantially conformal to electrode sidewall 112D. In the illustrative embodiment, the metallization structure 116 has a substantially planar lowermost surface 116E. In other embodiments, the lowermost surface 116E may extend into a section of the electrode portion 112B below the surface 112E.

Figure 6B:
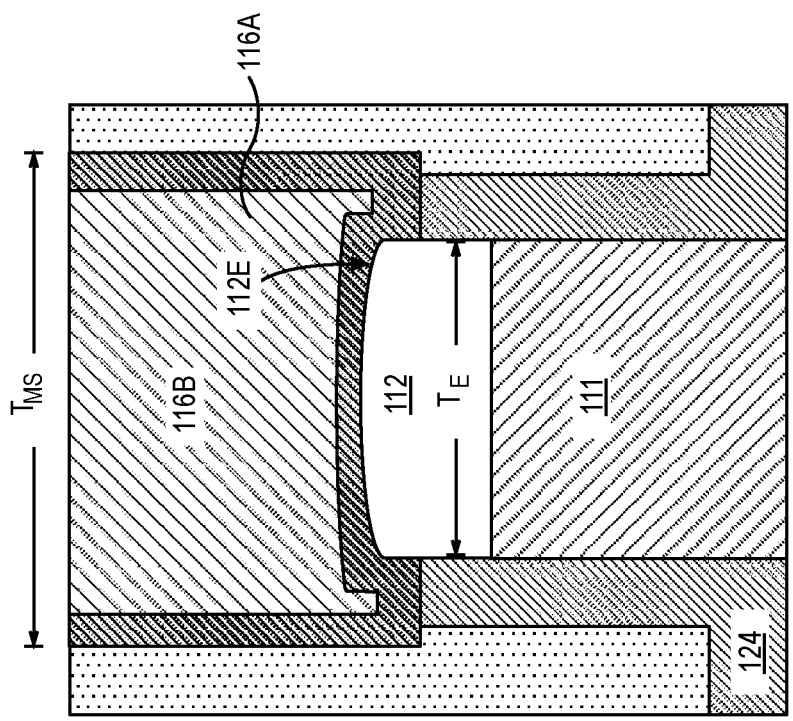
FIG. 6B illustrates a cross-sectional view of the first metallization structure coupled with the memory device, where the first metallization structure has a lateral thickness greater than a lateral thickness of the memory device and where the first metallization structure extends laterally beyond a dielectric spacer adjacent to the memory device.
Figure 6A:
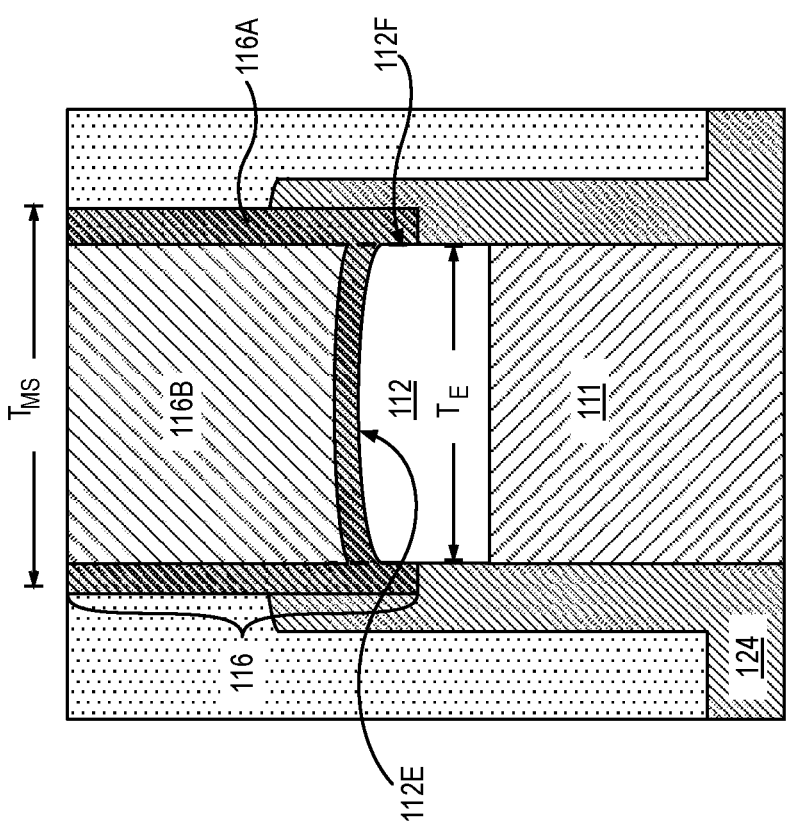
FIG. 6A illustrates a cross-sectional view of the first metallization structure coupled with the memory device, where the first metallization structure has a lateral thickness greater than a lateral thickness of the memory device.

Referring to FIGS. 1A, 3, 4 and 5, the metallization structure 116 has a lateral thickness, $T_{MS}$, that is less than a lateral thickness, $T_E$, of the electrode 112. In some embodiments, the metallization structure 116 has a lateral thickness, $T_{MS}$, that is equal to lateral thickness, $T_E$. In other embodiments, the metallization structure 116 has a lateral thickness, $T_{MS}$, that is greater than lateral thickness, $T_E$ as shown in the cross-sectional illustration of FIG. 6A. In the illustrative embodiment, the electrode 112 includes a metal and no oxygen. In other embodiments, the electrode 112 includes a metal and trace amounts of oxygen (less than 1 atomic percent). In the illustrative embodiment, the metallization structure 116 has a portion adjacent to a sidewall 112F of the electrode 112 and below the electrode surface 112E. As shown, the liner layer 116A is substantially conformal with electrode surface 112E. In some examples, TMs is sufficiently large that portions of the fill metal 116B also extend below the electrode surface 112E. In other examples, when $T_M s$ is substantially greater than $T_E$ dielectric spacer 124 does not extend vertically above top surface 112E as illustrated in FIG. 6B.

Referring again to FIG. 1A, the dielectric spacer includes silicon and one or more of nitrogen or carbon. Depending on embodiments the dielectric spacer 124 has a thickness, $T_{SP}$, between 5 nm and 30 nm. In an embodiment, the dielectric spacer 124 has a thickness, $T_{SP}$, between 5 nm and 30 nm in the memory region 102 and in the logic region 104.

Apparatus 100 further includes a dielectric 128 below the spacer 124 and above substrate 108 in the memory region 102 and in the logic region 104. In an embodiment, dielectric 126 includes silicon and one or more of oxygen, nitrogen, or carbon. In an embodiment, dielectric 128 includes silicon and one or more of oxygen, nitrogen, or carbon. Dielectric 128 may include a same material as the material of the dielectric 126.

Figure 7:
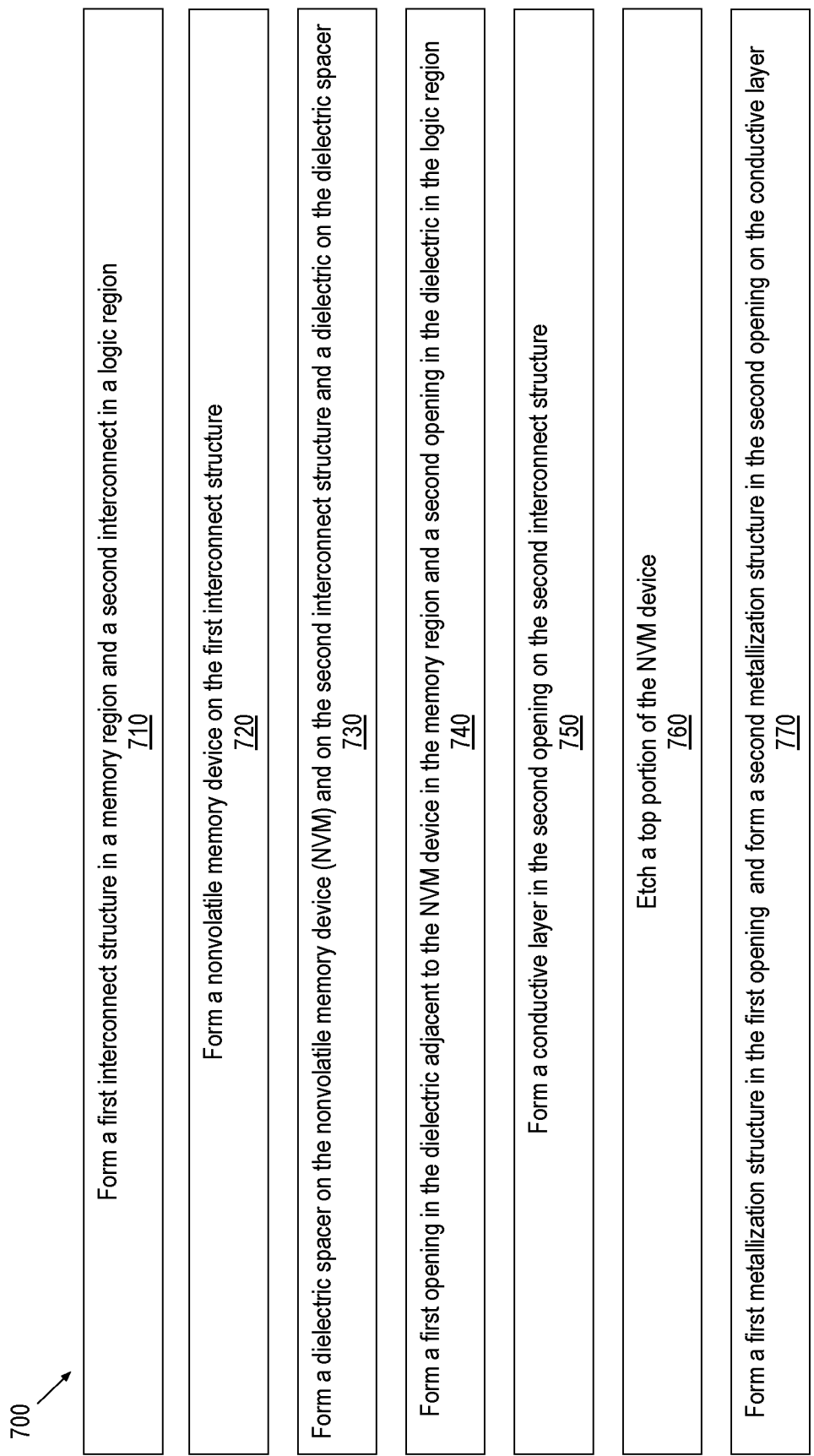
FIG. 7 illustrates a flow diagram for a method to fabricate a first metallization structure above a memory device in a memory region and a second metallization structure above an interconnect structure in a logic region, in accordance with an embodiment of the present disclosure.

FIG. 7 illustrates a flow diagram of a method to fabricate apparatus 100. The method 700 begins at operation 710 by forming interconnect structure 106 in memory region 102 and interconnect structure 118 in logic region 104 above substrate 108. In an embodiment, a dielectric mask is formed above the interconnect structure 118. The method 700 continues at operation 720 with the deposition patterning of a material layer stack for the formation of an NVM device on the interconnect structure 106 in the memory region. The method 700 continues at operation 730 with the formation of a dielectric spacer 124 in the memory region 102 on the NVM device 110 and in the logic region 104 on the interconnect structure 118. A dielectric 126 is formed on the dielectric spacer 124. The method 700 continues at operation 740 with the formation of a first opening in the dielectric in the memory region and a second opening in the dielectric in logic region. In an exemplary embodiment, the dielectric is etched in a first process operation and the dielectric spacer is etched in a second process operation. The method 700 continues at operation 750 with a selective formation of a conductive structure on the interconnect structure 118. In an exemplary embodiment, the conductive structure covers the interconnect structure 118 and is not formed on the NVM device 110. The method 700 continues at operation 760 with an etch process to remove a top portion of the NVM device. In an exemplary embodiment, the etch process is a low energy sputter etch process and re-sputters portions of the conductive structure within the second opening. The sputter etch process does not remove the conductive structure from the second opening. In some embodiments, portions of the conductive structure are redistributed and adhere to sidewalls of the dielectric 126 and the dielectric spacer 124 in the second opening. The method 700 concludes at operation 770 with the formation of a metallization structure 116 in the first opening and the formation of a metallization structure 118 in the second opening.

FIGS. 8A-8K illustrate cross-sectional views of the apparatus illustrated in FIG. 1A evolving as a fabrication method, such as method 700, is practiced.

FIG. 8A illustrates a cross-sectional view following the formation of interconnect structure 106 in the memory region 102 and interconnect structure 118 in the logic region 104 in the dielectric 128 above the substrate 108. In the illustrative embodiment, the interconnect structure 106 and interconnect structure 118 are surrounded by dielectric material 128 formed above the substrate 111. In an embodiment, the interconnect structure 106 and interconnect structure 118 are formed in a dielectric 128 by a damascene or a dual damascene process. In an embodiment, the interconnect structure 106 and interconnect structure 118 include a barrier layer, such as titanium nitride, ruthenium, tantalum, tantalum nitride, and a fill metal, such as copper, tungsten. In some examples, the dielectric 128 includes silicon and one or more of oxygen, nitrogen or carbon for e.g., silicon dioxide, silicon nitride, silicon carbide, or carbon doped silicon oxide. In an embodiment, the dielectric material 128 has an uppermost surface 128A that is substantially co-planar with each of the uppermost surfaces 118A and 106A of the interconnect structure 106 and interconnect structure 118, respectively. Depending on embodiments, the dielectric material 128 has a total thickness between 70 nm-120 nm. In some examples, the interconnect structure 106 and interconnect structure 118 are electrically connected to circuit elements such as an access transistor (not shown). Logic devices such as access transistors may be integrated with NVM devices such as a magnetic tunnel junction device, a spin orbit device or a resistive random-access memory device based on metal oxide, for example, to form embedded memory.

In the illustrative embodiment, a dielectric 800 is formed over a portion of the dielectric 128 in the memory region 102 and in the logic region 104. The dielectric 800 includes a material that is designed to protect one or more interconnect structures such as interconnect structure 118 during the formation of an NVM device in the memory region 102 as discussed below. The dielectric 800 may include silicon and one or more of nitrogen, oxygen and carbon. In an embodiment, dielectric 800 is blanket deposited on the dielectric 128, on the interconnect structure 106 and interconnect structure 118. The dielectric 800 may be deposited using a physical vapor deposition (PVD) or a chemical vapor deposition (CVD) process. The dielectric 800 may be deposited to a thickness between 10 nm and 30 nm. A thickness between 10 nm and 30 nm is sufficiently thin to provide protection to the interconnect structure 118 while forming an NVM device in the memory region in a downstream operation.

FIG. 8B illustrates a cross-sectional view of the structure in FIG. 8A following the formation of a mask 802 on the dielectric 800 and following the process to pattern the dielectric 800. In an embodiment, a mask 802 is formed on the dielectric 800 over the logic region 104. The mask 802 exposes the memory region 102. In some embodiments, the mask 802 is formed by a lithographic process. The dielectric 800 may be etched by a plasma etch process. The etch process utilized does not erode or sputter the interconnect structure 106. In some embodiments, a majority of the dielectric 800 is etched using a plasma etch process and a portion is left unetched in the memory region 102. The unetched portion of the dielectric 800 may be removed from the memory region 102 using a wet chemical process that does not sputter the material of the interconnect structure 106.

FIG. 8C illustrates a cross-sectional view of the structure in FIG. 8B following the formation of a material layer stack 804 for the formation of an NVM device. In an embodiment, the material layer stack 804 is blanket deposited on the interconnect structure 106, on portions of the dielectric 128 and on the dielectric 800. The material layer stack 804 includes a plurality of layers which may be sequentially deposited without breaking vacuum. In an embodiment, the material layer stack 804 includes layers for the formation of a magnetic tunnel junction and in other embodiments the material layer stack 804 includes layers for the formation of a resistive random-access memory (RRAM) device. In the illustrative embodiment, the material layer stack 804 includes a material layer stack 806 for NVM memory device and an electrode layer 808 on a top surface of material layer stack 806. A mask 810 is formed on the electrode layer 808. In some embodiments, the mask 810 is formed by a lithographic process. The mask 810 defines a shape and size of an NVM memory device to be formed.

FIG. 8D illustrates a cross-sectional view of the structure in FIG. 8C following the patterning of the material layer stack 804 to form a memory device such as NVM device 110. In an embodiment, the material layer stack 804 is patterned using a plasma etch process. In other embodiments, when the material layer stack 804 includes materials for a magnetic tunnel junction, different portions of the material layer stack 804 are patterned using plasma etch and ion beam milling processes. In the illustrative embodiment, the material layer stack 804 is patterned to form an electrode 112 on the NVM device 110.

Depending on a patterning method utilized, upper portions of the electrode 112 may become oxidized. In some embodiments, portions of the electrode 112 may become oxidized as illustrated in FIG. 1A. In other embodiments, a peripheral portion of the electrode 112 becomes oxidized as illustrated in FIG. 3A. Depending on a patterning method utilized, upper portions of the electrode 112 may become eroded as shown.

In an embodiment, a portion of the material layer stack 806 may remain adjacent to the dielectric 800 as shown. In other embodiments, when the dielectric 800 is sufficiently thin, a plasma over etch process or an ion milling process may remove the portion of the material layer stack 804 adjacent to the dielectric 800. Portions of the dielectric 128 may be recessed (indicated by dashed line 812) such as at a boundary between the logic region 104 and memory region 102.

In an embodiment, top portions of the dielectric 800 may be removed during the patterning process. The dielectric 800 remaining may be dependent on the incoming thickness and the severity of the plasma etch.

Figure 8E:
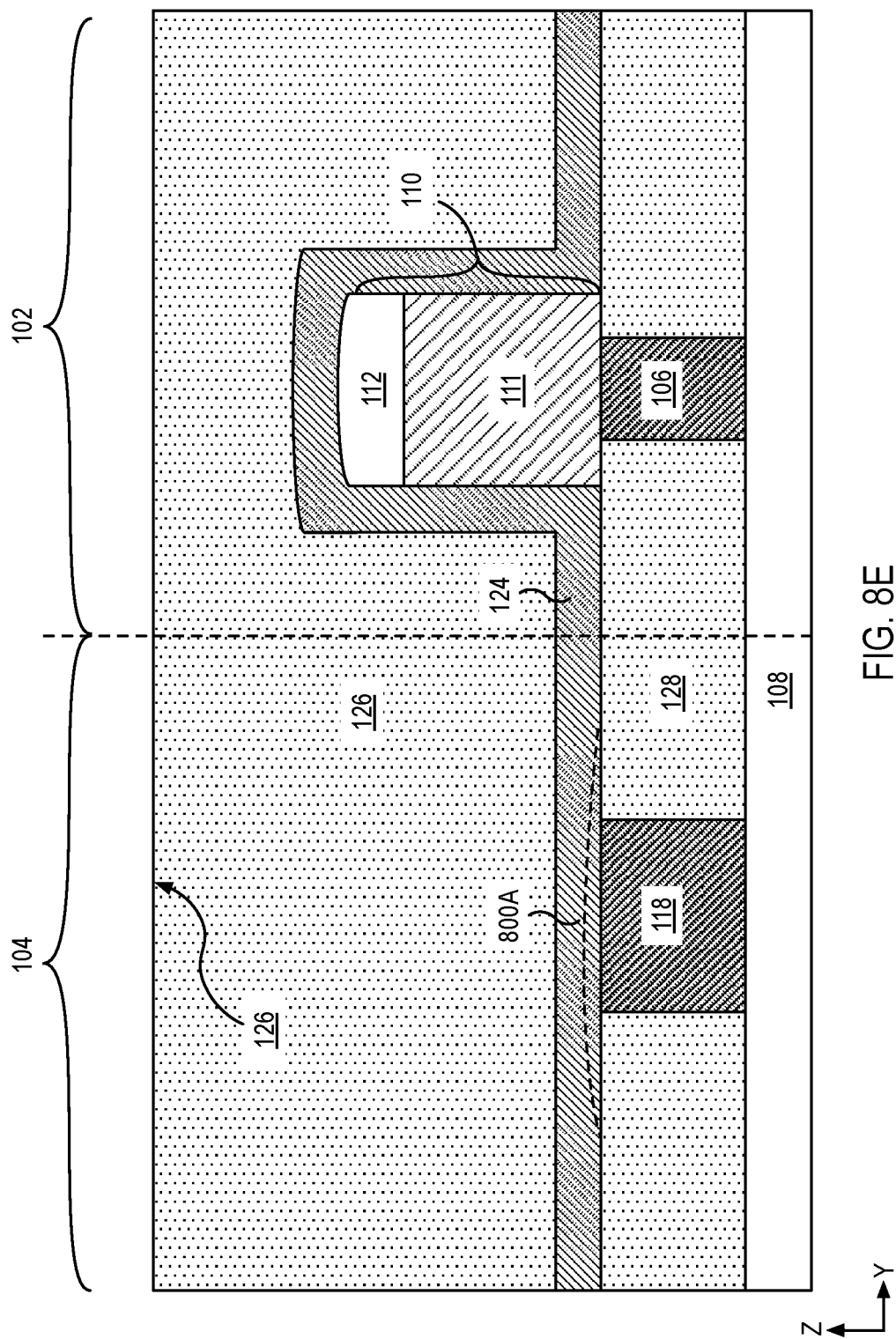
FIG. 8E illustrates a cross-sectional view of the structure in FIG. 8D following the removal of the second dielectric and formation of a dielectric spacer on the memory device in the memory region and on the second interconnect structure in the logic region.

FIG. 8E illustrates a cross-sectional view of the structure in FIG. 8D following the removal of the dielectric 800 and formation of a dielectric spacer 124 on the NVM device 110 in the memory region 102 and on the interconnect structure 118 in the logic region 104.

After the NVM device 110 is formed, the dielectric 800 may be removed from the logic region 104. For example, the dielectric 800 may be removed from the logic region 104 using a method described above to remove dielectric 800 from the memory region 102. In some examples, irregular portions 800A of the dielectric 800 (dashed line) may remain over the logic region 810 after removal of a majority of the dielectric 800. Such an irregular portion 800A may cover part or all of the interconnect structure 118. In some examples, the irregular portion 800A may remain at the boundary between the memory region 102 and the logic region 104.

After the dielectric 800 is removed, dielectric spacer 124 is formed on sidewalls of the NVM element 111, on sidewalls and on upper surfaces of the electrode 112 and on the dielectric 128. For example, the dielectric spacer may be formed by an atomic layer deposition (ALD) process. An ALD process is characterized by process uniformity of less than 1 nm and can conformally adhere to sidewalls of the NVM memory device 110. In other embodiments, the dielectric spacer 124 is blanket deposited using a PECVD or a PVD process. Depending on the material of the dielectric spacer 124 and the deposition process utilized, the dielectric spacer 124 may have a thickness between 3 nm and 20 nm. In an embodiment, the dielectric spacer 124 includes a single layer of a dielectric including silicon and at least one or nitrogen or carbon (for e.g., silicon nitride, or carbon doped silicon nitride). In other embodiments, the dielectric spacer 124 includes a first spacer layer including silicon and at least one or nitrogen and carbon and a second spacer layer on the first spacer layer, where the second layer includes silicon and oxygen and at least one of nitrogen, hafnium, aluminum or carbon.

In some examples, the dielectric spacer 124 is deposited immediately after the patterning process utilized to form the NVM device 110 but before breaking vacuum. In some such embodiments, the dielectric 800 may not be removed before deposition of the dielectric spacer 124. In other embodiments, dielectric 800 may be removed before dielectric spacer 124 without breaking vacuum.

The deposition process continues with a deposition of dielectric 126. In an embodiment, the dielectric 126 is blanket deposited on the dielectric spacer 124 using PECVD or PVD process. After deposition the dielectric 126 may be planarized. A planarization process is carried out, for example, to remove an excess dielectric material 126 from above the NVM device 110 in the memory region 102. The planarization process may include a chemical mechanical polish (CMP) process that forms a planar top surface 126A for subsequent process operations.

Figure 8F:
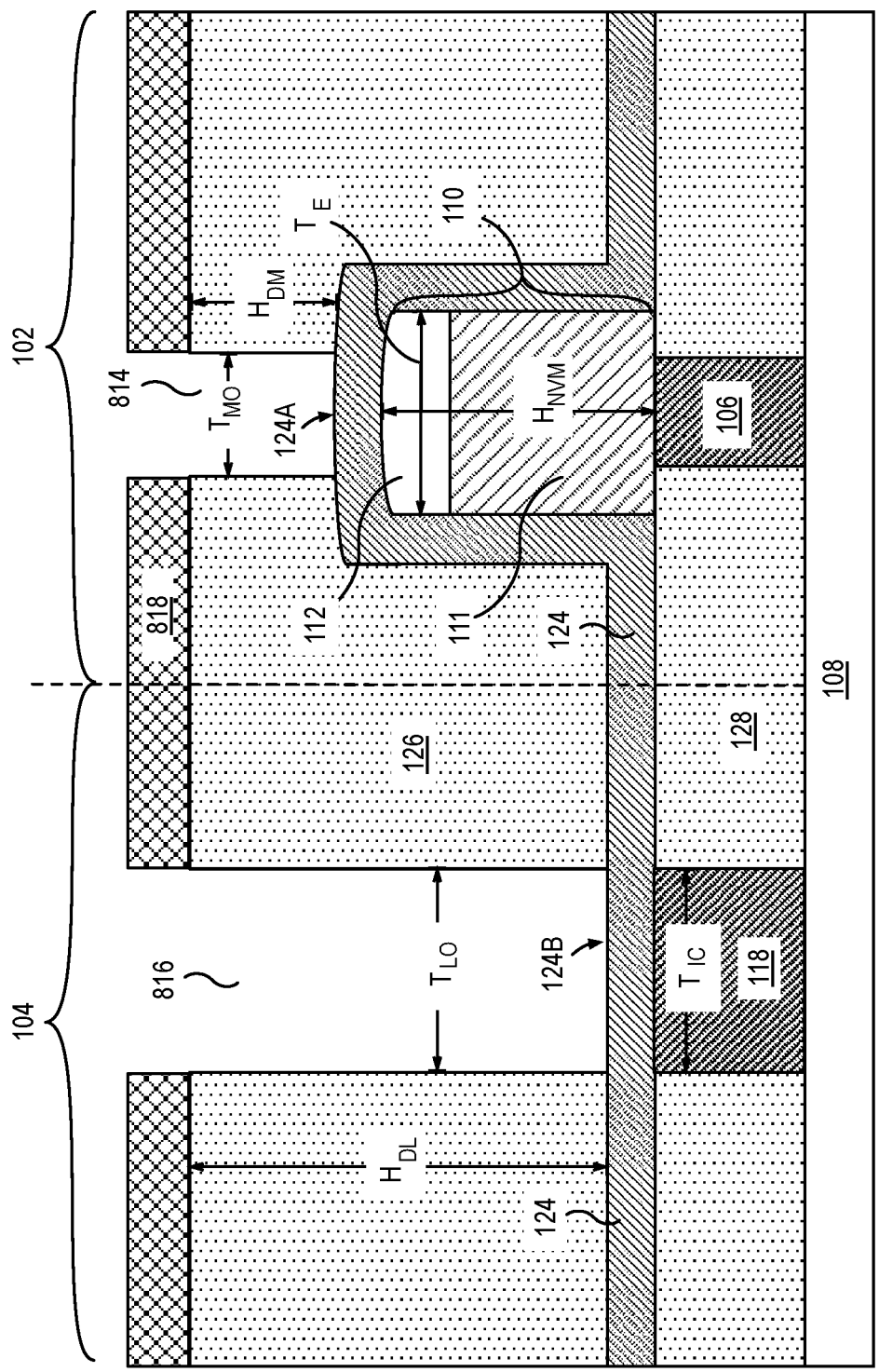
FIG. 8F illustrates a cross-sectional view of the structure in FIG. 8E following the formation of a first opening in the dielectric in the memory region and the formation of a second opening in the dielectric in the logic region.

FIG. 8F illustrates a cross-sectional view of the structure in FIG. 8E following the formation of an opening 814 in the dielectric 126 in the memory region 102 and the formation of an opening 816 in the dielectric 126 in logic region 104. In an embodiment, a mask 818 is formed on the dielectric 126 using a lithographic process.

In the illustrative embodiment, the dielectric 126 has a height, $H_{DM}$, as measured from a top surface 124A of the dielectric spacer 124 above the NVM 110 in the memory region 102. The dielectric 126 has a height, $H_{DL}$, as measured from a top surface 124A of the dielectric spacer 124, above the interconnect structure 118, in the logic region 104, as shown. A difference in the height between, $H_{DM}$ and $H_{DL}$ is determined by a height, $H_{NVM}$ of the NVM device 110. In an embodiment, the difference in the height between, $H_{DM}$ and $H_{DL}$ is between 50 nm and 70 nm.

The openings 814 and 816 may be formed by using a plasma etch process. In an embodiment, the plasma process etches the dielectric 126 to a depth substantially equivalent to $H_{DM}$ to form opening 814 in the memory region 102. The opening 814 exposes an uppermost surface 124A of the dielectric spacer in the memory region 102. The plasma etch also partially forms opening 814 to a depth, $H_{DM}$ in the logic region 104. A plasma over etch is performed until the opening 814 is fully formed and a dielectric spacer surface 124B is exposed. The plasma over etch process is sufficiently selective to dielectric spacer 124 to prevent etching of the dielectric spacer 124 in opening 814.

In the illustrative embodiment, the opening 814 has a lateral thickness, $T_{MO}$ that is less than a lateral thickness, $T_E$ of the electrode 112. $T_{MO}$ may be chosen depending on the extent of oxidation of the electrode 112. The opening 816 has a lateral thickness, $T_{LO}$ as shown. $T_{LO}$ may be for example, substantially equal to a lateral thickness, $T_{IC}$ of the interconnect structure 118 as shown.

Figure 8G:
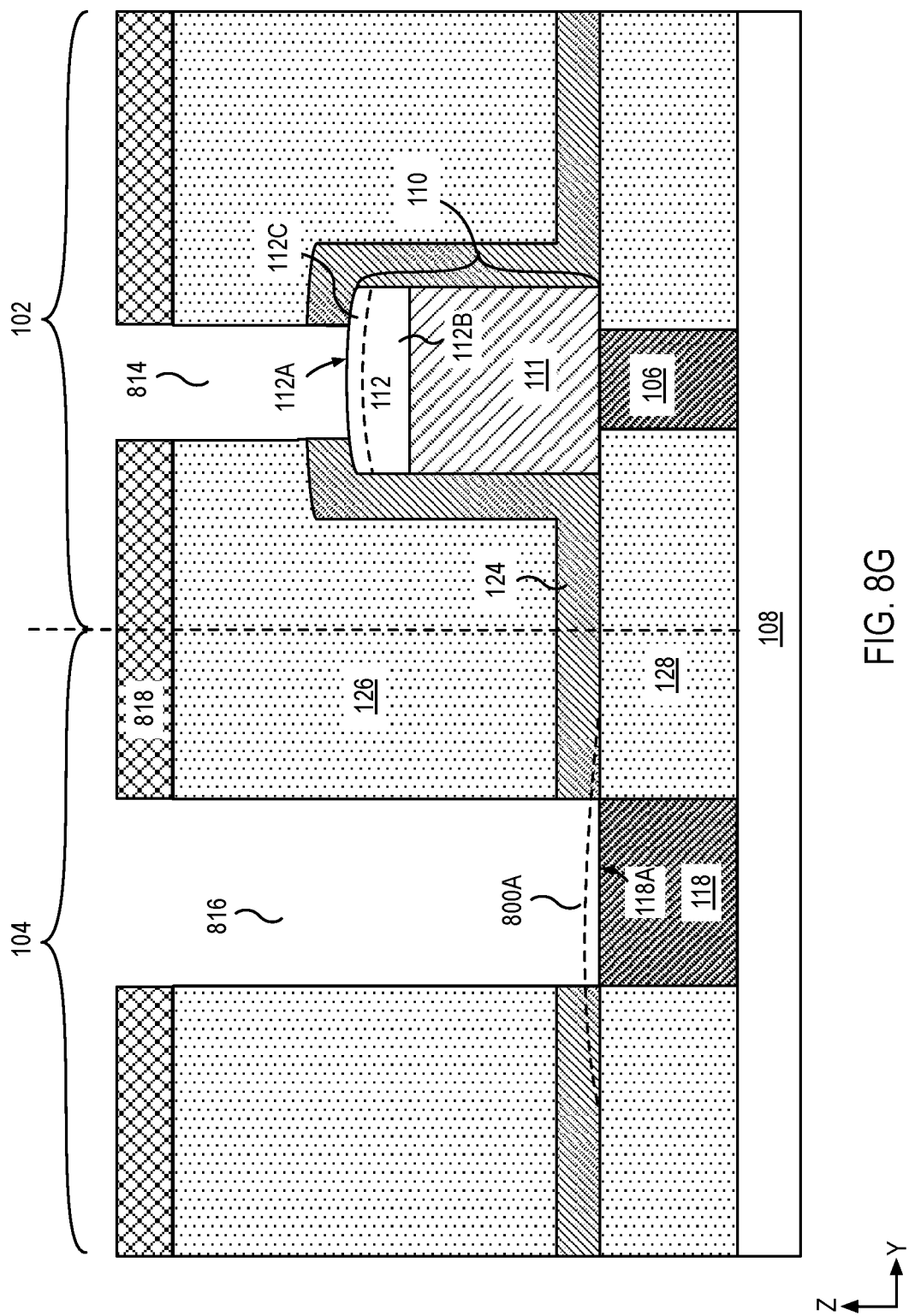
FIG. 8G illustrates the structure of FIG. 8F following an etch process to remove a portion of the dielectric spacer layer from the first opening and from the second opening.

FIG. 8G illustrates the structure of FIG. 8F following an etch process to remove a portion of the dielectric spacer 124 from the opening 814 and from the opening 816. In an embodiment, the dielectric spacer 124 is removed using a plasma etch process. The spacer etch process removes the dielectric spacer 124 in the memory region 102 and exposes the uppermost surface 112A of the electrode 112. In an embodiment, a section of an oxidized portion 112C of the electrode 112 is exposed after etching the dielectric spacer 124 from the opening 814, as shown.

In an embodiment, where there is no dielectric 800 remaining, the spacer etch may also expose the uppermost surface 118A of the interconnect structure 118. In an embodiment, where there is dielectric 800 remaining, the spacer etch process also removes the dielectric 800 and exposes the interconnect structure 118.

Figure 8H:
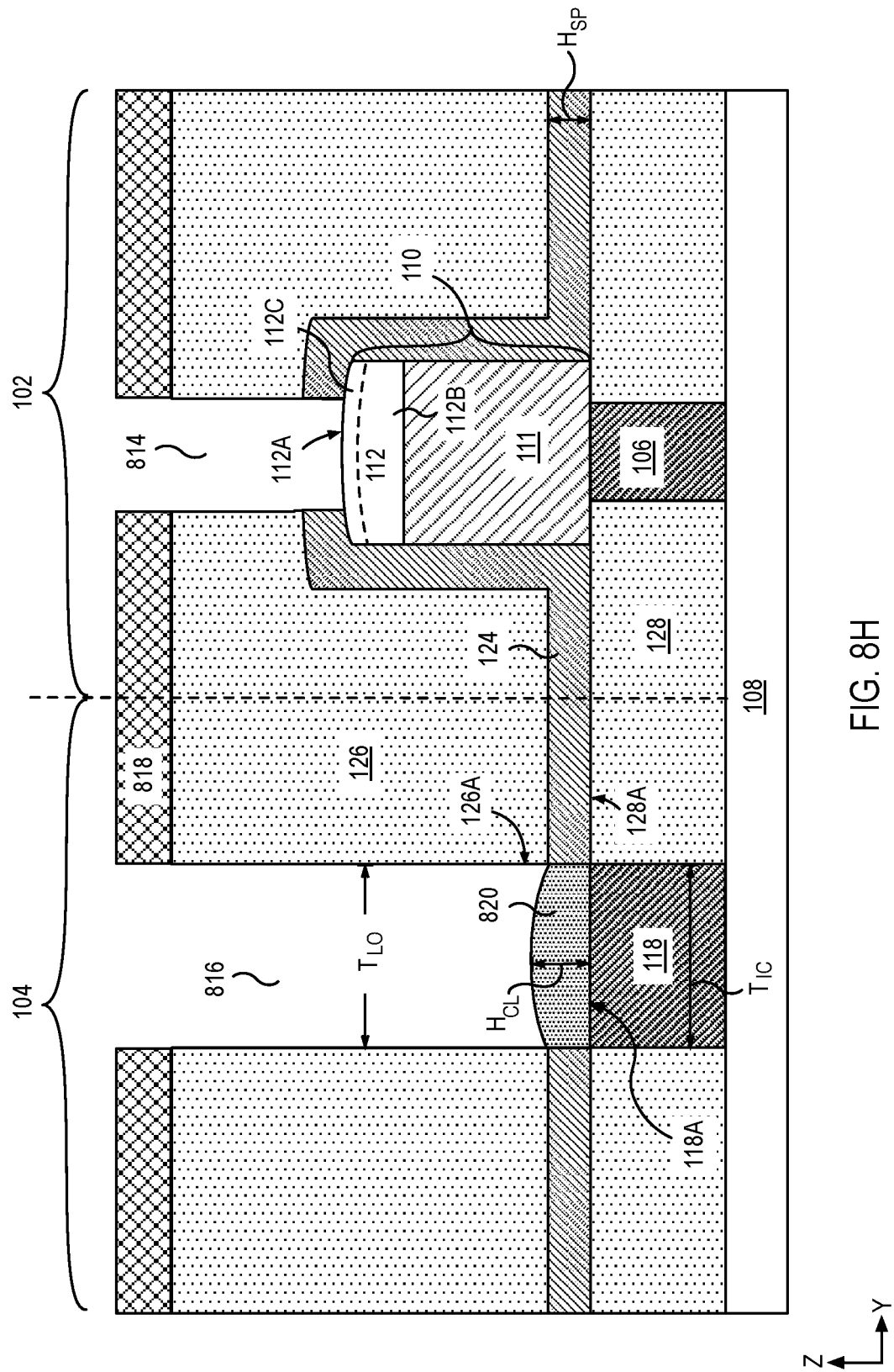
FIG. 8H illustrates a cross-sectional view of the structure of FIG. 8G following the formation of a conductive layer on the second interconnect structure in the logic region.

FIG. 8H illustrates a cross-sectional view of the structure of FIG. 8G following the formation of a conductive layer 820 on the interconnect structure 118 in the logic region 104. In an embodiment, the conductive layer 820 includes a material that is the same or substantially the same as the material of the conductive structure 122. In an embodiment, the conductive layer is selectively formed on the uppermost surface 118A of the interconnect structure 118. The conductive layer 820 may be formed using a chemical vapor deposition or atomic layer deposition process with a suitable precursor and a substrate temperature tuned such that growth only nucleates on electrically conductive surfaces such as 118. In an embodiment, the substrate temperature is less than 275 degrees Celsius.

In an embodiment, the conductive layer 122 has a height, $H_{CL}$, (as measured from uppermost surface 118A) between 3 nm and 10 nm. In the illustrative embodiment, where $T_{LO}$ is substantially the same as $T_{IC}$, the conductive layer is grown to fill a lateral thickness, $T_{LO}$, of the opening 816 and extends to contact the dielectric spacer 124 in the logic region 104. In some embodiments, depending on a height, $H_{SP}$, of the dielectric spacer 124 (as measured from uppermost surface 128A) the conductive layer 820 can grow and be adjacent to sidewall 126A of dielectric 126.

Figure 8I:
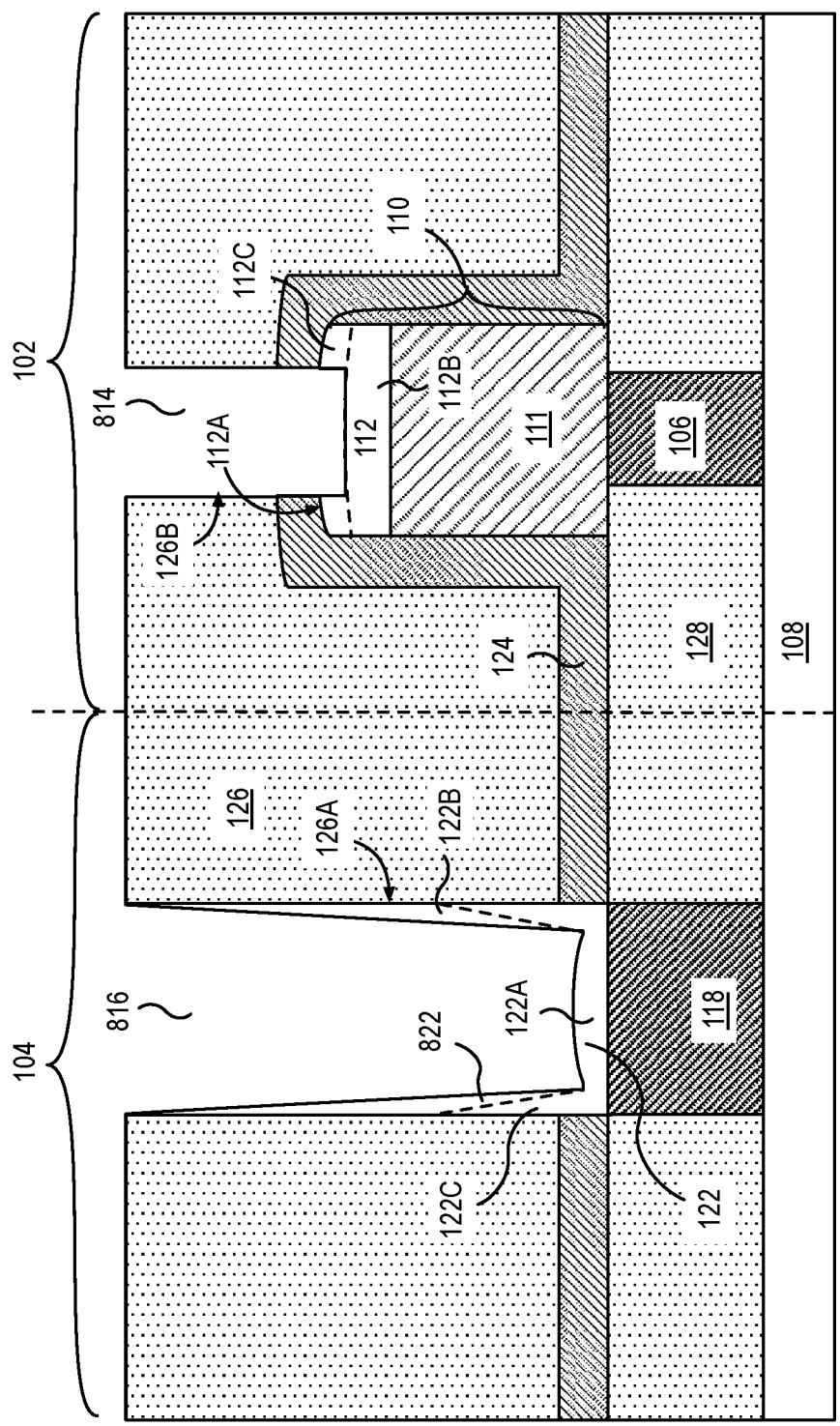
FIG. 8I illustrates the structure of FIG. 8H following the process of removing a portion of the electrode, and sputtering portions of the conductive layer on to sidewalls of the dielectric.

FIG. 8I illustrates the structure of FIG. 8H following the process of removing a portion of the electrode 112, and sputtering portions of the conductive layer 820 on to sidewalls of the dielectric to form a conductive structure 122.

In an embodiment, a sputter cleans process is utilized to remove oxidized portion 112C of the electrode 112 in the opening 814. The sputter etch is carried out prior to deposition of conductive materials to form a metallization structure in the opening 814. In an embodiment, the sputter etch utilizes atoms of an energetic neutral beam. For example, a beam including atoms of one or more of argon, krypton or xenon may be utilized to non-reactively sputter and remove sections of the electrode portion 112C. In the illustrative embodiment, the sputter etch is performed until all of the oxidized portion 112C of the electrode 112 is removed and a top surface of the electrode portion 112B is exposed.

In the logic region 104, the sputter etch process may cause the material of the conductive structure 122 to be sputtered and redeposited on sidewall 126A of the dielectric 126. In an embodiment, the conductive structure 122 has one or more features of the conductive structure 122 illustrated in FIG. 1A, for example conductive structure portions 122B and 122C may be formed on the dielectric sidewall 126A. The duration and intensity of the sputter process may affect re-deposition of the material of the conductive structure 122 on to sidewall 126A. In some embodiments, the sputtering process forms conductive structure portions 122B and 122C that are indicated by the dashed line 822. In the illustrative embodiment, the material of the conductive structure portions 122B and 122C are redeposited along the entire sidewall 126A. Depending on proximity between the openings 814 and 816 trace amounts of the material of the conductive structure 122 may adhere to sidewall 126B in the opening 814 in the memory region 102.

In an embodiment, when the incoming material of the conductive structure 122 has a concave up shape, the sputter etch process forms a conductive structure portion 122A having a concave up profile as shown. In other embodiments, where an incoming material of the conductive structure 122 has a relatively planar profile, the sputter etch process forms a conductive structure portion 122A having a concave down profile as shown in FIG. 2A.

Figure 8J:
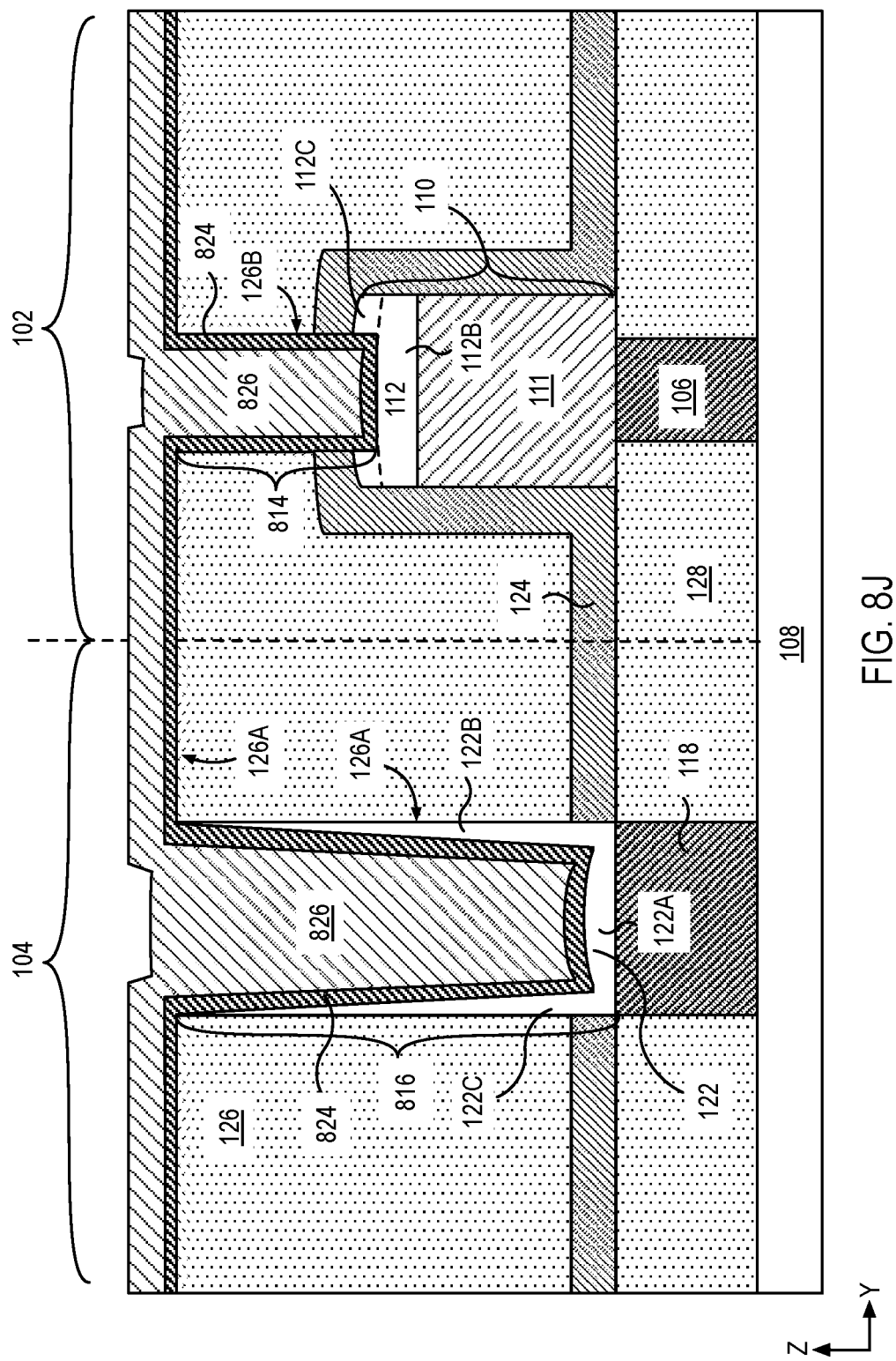
FIG. 8J illustrates a cross-sectional view of the structure of FIG. 8I following the formation of a barrier layer on the electrode in the memory region and on the conductive layer in the logic region, and a fill metal on the barrier layer, in accordance with an embodiment of the present disclosure.

FIG. 8J illustrates a cross-sectional view of the structure of FIG. 8I following the formation of a barrier layer 824 on the electrode 112 in the memory region 102 and on the conductive structure 122 in the logic region 104 and formation of a fill metal 826 on the barrier layer 824.

In an embodiment, the barrier layer 824 is blanket deposited in the opening 814 on the electrode portion 112B, adjacent to sections of the electrode portion 112C, adjacent to dielectric spacer 124, and adjacent to dielectric sidewall 126B. The barrier layer 824 is also deposited on uppermost surface of the dielectric 126C. In the illustrative embodiment the barrier layer 824 is blanket deposited in the opening 816, on the conductive structure 122, adjacent conductive structure portions 122A, 122B and 122C, and adjacent to dielectric sidewall 126A. The barrier layer 824 may include one or more of Ti, Al, Ru, Ni or Ta. In an embodiment, the barrier layer 824 is deposited using a plasma enhanced chemical vapor deposition (PECVD) or an ALD process.

The fill metal 826 may include one or more of Cu, Ni, TaN, Mo or W. In an embodiment, the fill metal 826 is deposited using a plasma enhanced chemical vapor deposition (PECVD) or an ALD process. For example, the fill metal 826 may be blanket deposited on the barrier layer 824 in the opening 814, on the barrier layer 824 above the dielectric 126 and on the barrier layer 824 in the opening 816.

Figure 8K:
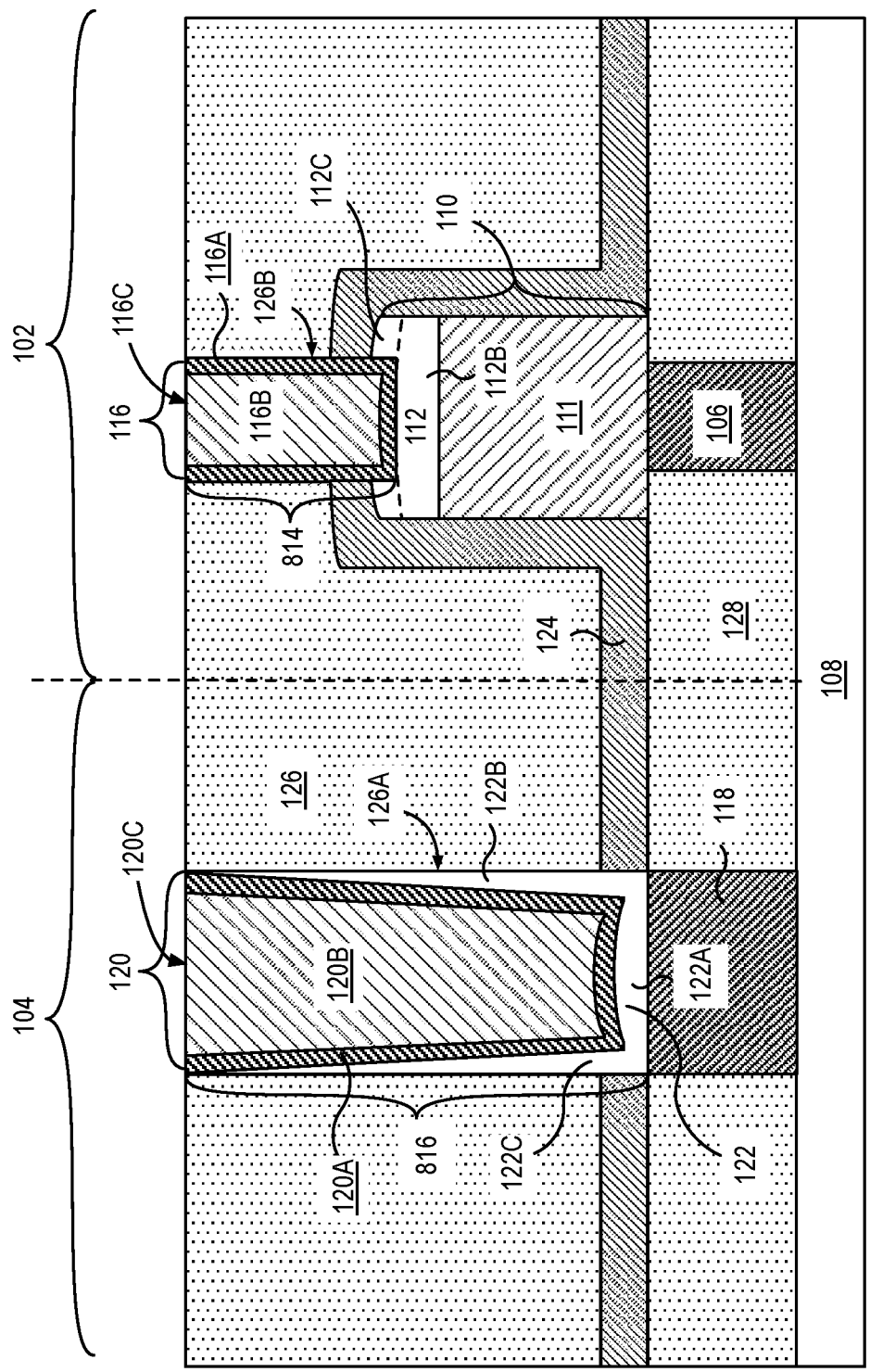
FIG. 8K illustrates a cross-sectional view of the structure of FIG. 8J following the formation of a metallization structure on the electrode in the memory region and a metallization structure on the conductive structure in the logic region.

FIG. 8K illustrates a cross-sectional view of the structure of FIG. 8J following the formation of a metallization structure 116 on the electrode 112 in the memory region 102 and a metallization structure 120 on the conductive structure 122 in the logic region 104.

A planarization process may be utilized to remove portions of the barrier layer 824 and the fill metal 826 from above the openings 814 and 816 and from above the dielectric 126 in the structure of FIG. 8J. In one embodiment, the planarization process includes a chemical mechanical polish (CMP) process. Referring again to FIG. 8K, the CMP process forms metallization structure 116 in the opening 814 and metallization structure 118 in the opening 816 as shown. The metallization structure 116 includes a barrier layer 116A and a fill metal 116B on the barrier layer 116A and the metallization structure 120 includes a barrier layer 120A and a fill metal 120B on the barrier layer 120A. Uppermost surface 116C of the metallization structure 116, uppermost surface 120C of the metallization structure 120 and uppermost surface 126A of the dielectric 126 may be co-planar or substantially co-planar after the CMP process.

FIG. 9A illustrate a cross sectional view of an example of an NVM device 110 such as a magnetic tunnel junction (MTJ) memory device 110, in accordance with an embodiment of the present disclosure.

In the illustrated embodiment, the MTJ memory device 110 includes a bottom electrode 902 on the interconnect structure 106, a synthetic antiferromagnetic (SAF) structure 904 on the bottom electrode, a fixed magnet 906 above the SAF structure 904, a tunnel barrier 908 on the fixed magnet 906, a free magnet 910 disposed on the tunnel barrier 908, electrode 112 on the free magnet 910. In some embodiments, the MTJ memory device 110 includes an intermediate conductive electrode between the free magnet 910 and the electrode 112.

In an embodiment, the fixed magnet 906 includes magnetic materials with sufficient perpendicular fixed magnetization. In an embodiment, the fixed magnet 906 can include alloys such as CoFe, CoFeB, or FeB. The alloys of CoFe, CoFeB or FeB may include doping with one or more of Ta, Hf, Mo, Ir, Ru, Si or C, to promote high perpendicular anisotropy. Alternatively, the alloys of CoFe, CoFeB or FeB may include thin layers of Ta or Mo to promote high perpendicular anisotropy. In an embodiment, the magnet 110 comprises a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the fixed magnet 906 is FeB, where the concentration of boron is between 10-40 atomic percent of the total composition of the FeB alloy. Alternatively, the fixed magnet 906 may include a layer of cobalt, having a thickness between 0.5-1 nm, thin layer of Ta, W or Mo on the layer of cobalt to enable transition in crystal texture in the magnet 910 from FCC (111) to BCC (001) and an alloy of Co, Fe and B om the thin layer of Ta, W or Mo.

The fixed magnet 906 has a magnetization 907 that remains fixed during operation. For example, magnetization 907 may orient in the positive or in a negative Z-direction. In the illustrative embodiment, the magnetization 907 in the positive Z direction. The direction of magnetization 907 is perpendicular to a plane of an uppermost surface 106A of interconnect structure 106. The fixed magnet 906 having a magnetization 907 that is perpendicular to the plane of the uppermost surface 106A may also be known as a perpendicular fixed magnet 906.

In an embodiment, tunnel barrier 908 includes a material suitable for allowing electron current having a majority spin to pass through tunnel barrier 908, while impeding, at least to some extent, electron current having a minority spin from passing through tunnel barrier 908. Thus, tunnel barrier 908 (or spin filter layer) may also be referred to as a tunneling layer for electron current of a particular spin orientation. In an embodiment, the tunnel barrier 908 includes a material such as, but not limited to, oxygen and at least one of magnesium (e.g., a magnesium oxide, or MgO), or aluminum (e.g., an aluminum oxide such as $Al_2O_3$). In the illustrative embodiment, the tunnel barrier 908 including MgO has a crystal orientation that is (001) and is lattice matched to fixed magnet 906 below the tunnel barrier 908 and free magnet 910 above tunnel barrier 908. In an embodiment, a free magnet 910 including a $Co_{100-x-y}Fe_xB_y$, is highly lattice matched to the tunnel barrier 908 including an MgO. Lattice matching a crystal structure of the free magnet 910 with the tunnel barrier 908 enables a higher tunneling magnetoresistance (TMR) ratio in the MTJ memory device 110. In an embodiment, tunnel barrier 908 is MgO and has a thickness in the range between 1 nm to 2 nm. In exemplary embodiments, where magnets 906 and 908 include CoFeB, MgO is between 0.9 nm and 1.1 nm.

The magnet 116 has a magnetization 911 that may change orientation during operation. For example, magnetization 911 may orient in the positive or negative Z-direction as indicated by the bi-directional arrow. Such a magnet 910 is herein referred to as a free magnet 910. The direction of magnetization 911 is perpendicular to a plane of an uppermost surface 106A of the interconnect structure 106. The free magnet 910, having a magnetization 907 that is perpendicular to the plane of the uppermost surface 106A, may also be known as a perpendicular free magnet 910.

In the illustrative embodiment, the free magnet 910 includes a magnetic material such as Co, Ni, Fe or alloys of these materials. In an embodiment, the free magnet 116 includes a magnetic material such as CoB, FeB, CoFe or CoFeB. In some embodiments, the free magnet 910 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 910 is FeB, where the concentration of boron is between 10 and 40 atomic percent of the total composition of the FeB alloy. In an embodiment, free magnet 910 has a thickness in the range of 1 nm to 1.5 nm.

In an embodiment, the bottom electrode 902 includes an amorphous conductive layer. In an embodiment, the bottom electrode 902 is a topographically smooth electrode. In an embodiment, the bottom electrode 902 includes a material such as W, Ta, TaN or TiN. In a specific embodiment, the bottom electrode 902 is composed of Ru layers interleaved with Ta layers. In an embodiment, the bottom electrode 902 has a thickness between 20 nm-50 nm.

In an embodiment, the free magnet 910 and the fixed magnet 906 can have approximately similar thicknesses and an injected spin polarized current which changes the direction of the magnetization 911 in the free magnet 910 can also affect the magnetization 907 of the fixed magnet 906. In an embodiment, to make the fixed magnet 906 more resistant to accidental flipping the fixed magnet 906 has a higher magnetic anisotropy than the free magnet 910. In the illustrative embodiment, a synthetic antiferromagnetic (SAF) structure 904 is utilized where the SAF structure 904 is coupled with the fixed magnet 906.

FIG. 9B illustrates a cross-sectional view of the SAF structure 904, in an accordance of an embodiment of the present disclosure. In an embodiment, the SAF structure 904 includes a non-magnetic layer 904B sandwiched between a first pinning ferromagnet 904A and a second pinning ferromagnet 904C as depicted in FIG. 9B. The first pinning ferromagnet 904A and the second pinning ferromagnet 904C are anti-ferromagnetically coupled to each other. The pinning ferromagnets 904A, 904C may be designed to have high coercive fields and a high degree of perpendicular magnetic anisotropy. In an embodiment, the first pinning ferromagnet 904A includes a layer of a magnetic metal such as Co, Ni, Fe, or alloys of magnetic metals such as Co, Ni, Fe, and alloys such as Co—Pd, Cp-Pt, Co—W or Co—Mo.

In other embodiments the first pinning ferromagnet 904A includes one or more bilayers having a layer of non-magnetic metal on a layer of magnetic metal. Examples of bilayers include Co/Pd, Co/Pt, Co/Ni, Co/W or Co/Mo. In an embodiment, the number of bilayers in first pinning ferromagnet 904A may range between 2 and 6. An uppermost bilayer in the one or more bilayers is capped by a thin layer of magnetic material such as Co. In an embodiment, the second pinning ferromagnet 904C includes a layer of a magnetic metal such as Co, Ni, Fe, or alloys of magnetic metals such as Co, Ni, Fe, and alloys such as Co—Pd, Cp-Pt, Co—W or Co—Mo. In other embodiments the second pinning ferromagnet 904C includes one or more bilayers having a layer of non-magnetic metal on a layer of magnetic metal. Examples of bilayers include Co/Pd, Co/Pt, Co/Ni, Co/W or Co/Mo. In an embodiment, the number of bilayers in second pinning ferromagnet 904B may range between 6 and 10. An uppermost bilayer in the one or more bilayers is capped by a thin layer of magnetic material such as Co.

In an embodiment, the non-magnetic layer 904B includes a ruthenium or an iridium layer. In an embodiment, a ruthenium based non-magnetic layer 904B has a thickness between 0.3-1.0 nm for anti-ferromagnetic coupling between the first pinning ferromagnet 904A and the second pinning ferromagnet 904C.

In embodiment, an additional layer of non-magnetic spacer layer 904D may exist between the fixed magnet 906 and the SAF structure 904. The non-magnetic spacer layer 904D ferromagnetically couples the pinning ferromagnet 904C and the fixed magnet 906. In an embodiment, a non-magnetic spacer layer may include a metal such as Ta, or Ru.

In an embodiment, the bottom electrode 902 includes an amorphous conductive layer. In an embodiment, the bottom electrode 902 is a topographically smooth electrode. In an embodiment, the bottom electrode 902 includes a material such as W, Ta, TaN or TiN. In a specific embodiment, the bottom electrode 902 is composed of Ru layers interleaved with Ta layers. In an embodiment, the bottom electrode 902 has a thickness between 20 nm-50 nm.

While the various embodiments here are illustrated with reference to an MTJ device 110 the embodiments are also applicable to spin valves. In an embodiment, a spin valve device includes a layer 908 that is a metal oxide or a metal between the free magnet 910 and fixed magnet 906, instead of a tunneling dielectric MgO.

FIG. 9B illustrate a cross sectional view of an NVM device 110 such as a resistive random-access memory (RRAM) device 110, in accordance with an embodiment of the present disclosure. In the illustrated embodiment, the RRAM device 110 includes a bottom electrode 912, a switching layer 914 above the bottom electrode 912, an oxygen exchange layer 916 above the switching layer 914, and a top electrode 918 disposed on the oxygen exchange layer 916.

In an embodiment, the bottom electrode 912 includes an amorphous conductive layer. In an embodiment, the bottom electrode 912 is a topographically smooth electrode. In an embodiment, the bottom electrode 912 includes a material such as W, Ta, TaN or TiN. In a specific embodiment, the bottom electrode 902 is composed of Ru layers interleaved with Ta layers. In an embodiment, the bottom electrode 912 has a thickness between 20 nm-50 nm. In an embodiment, the top electrode 918 includes a material such as W, Ta, TaN or TiN. In an embodiment, the top electrode 918 has a thickness between 30-70 nm. In an embodiment, the bottom electrode 912 and the top electrode 918 include a same metal such as Ta or TiN. The top electrode 918 and bottom electrode 912 are both work function electrodes.

The switching layer 914 may be a metal oxide, for example including oxygen and atoms of one or more metals, such as, but not limited to Hf, Zr, Ti, Ta or W. In the case of titanium or hafnium, or tantalum with an oxidation state +4, the switching layer 914 has a chemical composition, $MO_X$, where O is oxygen and X is or is substantially close to 2. In the case of tantalum with an oxidation state +5, the switching layer 914 has a chemical composition, $M_2O_X$, where O is oxygen and X is or is substantially close to 5. In an embodiment, the switching layer 914 a thickness approximately in the range of 1-5 nm.

The oxygen exchange layer 916 acts as a source of oxygen vacancy or as a sink for $O^{2-}$. In an embodiment, the oxygen exchange layer 916 is composed of a metal such as but not limited to, hafnium, tantalum or titanium. In an embodiment, oxygen exchange layer 916 has a thickness in the range of 5-20 nm. In an embodiment, the thickness of the oxygen exchange layer 916 is at least twice the thickness of the switching layer 914. In another embodiment, the thickness of the oxygen exchange layer 916 is at least twice the thickness of the switching layer 914. In an embodiment, the RRAM device 110 has a combined total thickness of the individual layers between 60 nm-100 nm and width between 10 nm and 50 nm.

Figure 10:
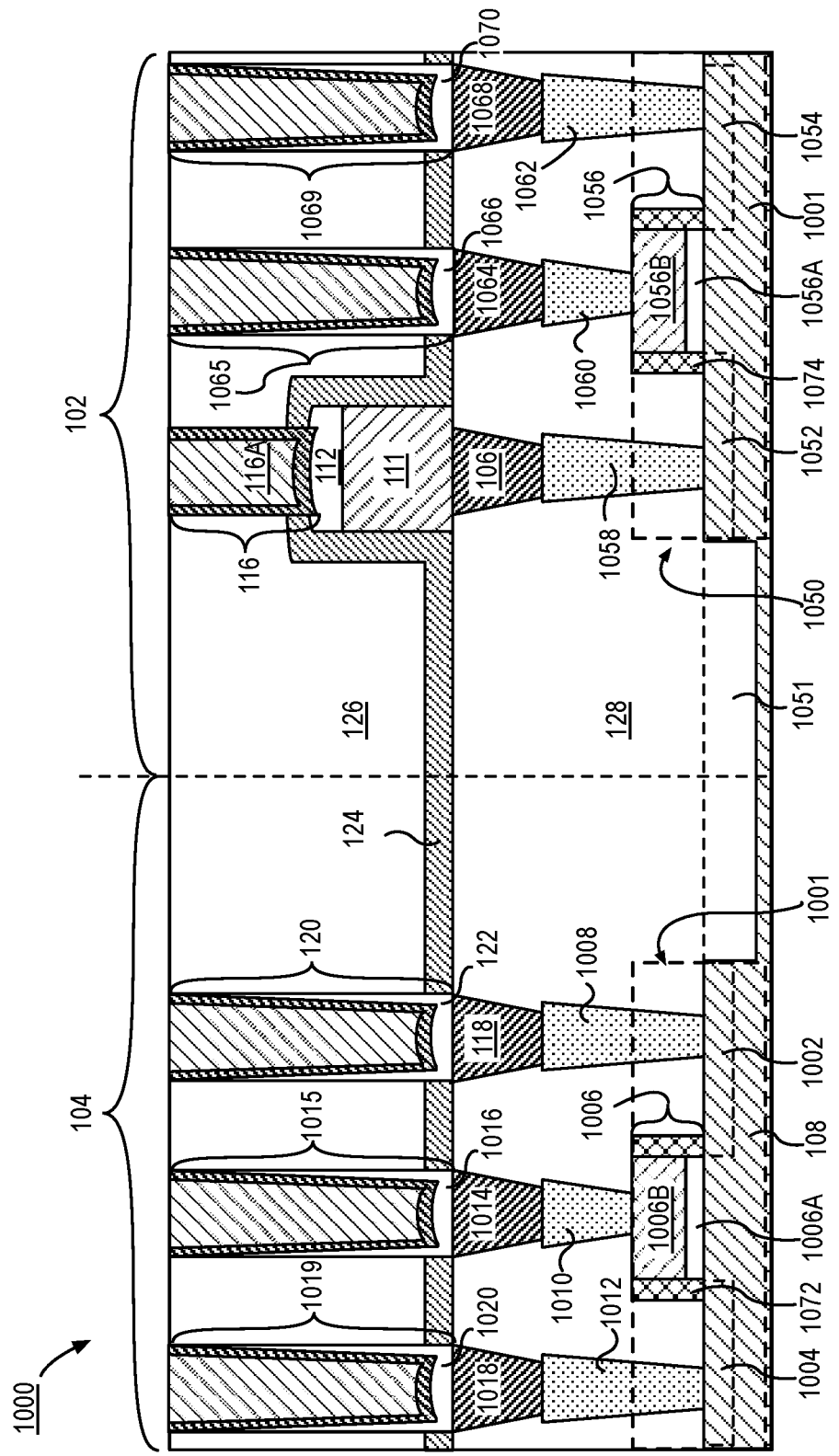
FIG. 10 illustrates a cross-sectional view of a first metallization structure coupled with a memory device that is coupled with a first interconnect structure above a first transistor and a second metallization structure coupled with a second interconnect structure above a second transistor where the first and the second transistor are above a common substrate.

FIG. 10 illustrates a system 1000 includes a transistor 1001 in a logic region 104 above a substrate 108. Interconnect structure 118 is coupled with a drain region 1002 of the transistor 1000. A metallization structure 120 is coupled with the interconnect structure 118. A conductive structure 122 is directly between the metallization structure 120 and the interconnect structure 118. The conductive structure 120 has one or more features described above in association with FIGS. 1A, 2A, 2B, 2C and 2D.

In an embodiment, the transistor 1002 is a metal-oxide-semiconductor field-effect transistors (MOSFET or simply MOS transistors). In various implementations of the present disclosure, the transistor 1001 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the transistor 1001 further includes a source region 1004 and a gate 1006. The transistor 1001 further includes a drain contact 1008 above and electrically coupled with the interconnect structure 118. In the illustrative embodiment, the drain contact 1008 is directly adjacent to the interconnect structure 118. In other embodiments, the drain contact 1008 is coupled to the interconnect structure 118 through one or more intervening interconnect structures. The transistor 1001 further includes a gate contact 1010 above and electrically coupled to the gate 1006, and a source contact 1012 above and electrically coupled to the source region 1004, as is illustrated in FIG. 10.

In the illustrative embodiment, the system 1000 further includes an interconnect structure 1014 directly adjacent to the gate contact 1010. In other embodiments, the gate contact 1014 is coupled to the interconnect structure 1014 through one or more intervening interconnect structures. A metallization structure 1015 is coupled with the interconnect structure 1014. A conductive structure 1016 is directly between the interconnect structure 1014 and the metallization structure 1015. Conductive structure 1016 has one or more properties of the conductive structure 120.

As shown an interconnect structure 1018 is directly adjacent to the source contact 1012. In other embodiments, the source contact 1012 is coupled to the interconnect structure 1018 through one or more intervening interconnect structures. A metallization structure 1019 is coupled with the interconnect structure 1018. A conductive structure 1020 is directly between the interconnect structure 1018 and the metallization structure 1019. Conductive structure 1020 has one or more properties of the conductive structure 120.

The system 1000 includes a transistor 1050 in a memory region 102 above the substrate 108. As show the transistor 1050 is separated from the transistor 1001 by an isolation 1051 and dielectric 128. As shown the isolation is in a recess in the substrate 108 in a region between the transistor 1001 and 1051. In an embodiment, the transistor 1050 further includes a drain region 1052, source region 1054 and a gate 1056. The transistor 1050 further includes a drain contact 1058 coupled with the drain region 1052, a gate contact 1060 coupled with the gate 1056 and a source contact 1062 coupled with the source region 1054.

Drain contact 1058 is coupled with interconnect structure 106. In the illustrative embodiment, the drain contact 1058 is directly adjacent to the interconnect structure 106. In other embodiments, the drain contact 1058 is coupled to the interconnect structure 118 through one or more intervening interconnect structures.

Non-volatile memory device 110 is coupled with the interconnect structure 106. In the illustrative embodiment, the non-volatile memory device 110 is directly adjacent to the interconnect structure 106. The non-volatile memory device 110 includes non-volatile memory element 111 and electrode 112 on the non-volatile memory element 111. Metallization structure 116 is coupled with the memory device 110. Electrode 112 and metallization structure 116 each have one or more features of the electrode 112 and the metallization structure 116 described above in association with FIGS. 1A, 1B, 3, 4 and 5.

In the illustrative embodiment, the system 1000 further includes an interconnect structure 1064 directly adjacent to gate contact 1060. In other embodiments, the interconnect structure 1014 is coupled to the gate contact 1060 through one or more intervening interconnect structures. A metallization structure 1065 is coupled with the interconnect structure 1064. In some embodiments, conductive structure the same as or substantially the same as conductive structure 122 may be coupled with interconnects in the memory region 102. In the illustrative embodiment, a conductive structure 1066 is directly between the interconnect structure 1064 and the metallization structure 1065 in the memory region 102. Conductive structure 1066 has one or more properties of the conductive structure 120.

As shown the system 1000 further includes an interconnect structure 1068 directly adjacent to source contact 1062. In other embodiments, the interconnect structure 1068 is coupled to the source contact 1062 through one or more intervening interconnect structures. A metallization structure 1069 is coupled with the interconnect structure 1068. In the illustrative embodiment, a conductive structure 1070 is directly between the interconnect structure 1068 and the metallization structure 1069 in the memory region 102. Conductive structure 1069 has one or more properties of the conductive structure 120.

The system 1000 further includes a dielectric spacer 124 that extends from the memory region 102 to the logic region 104. The dielectric spacer 124 is adjacent to the conductive structure 1070, conductive structure 1066, and NVM device 110. The dielectric spacer 124 extends over the dielectric 128 and into the logic region 104. In the logic region 104 the dielectric spacer 124 is adjacent to the conductive structure 122, conductive structure 1016 and conductive structure 1020. In some examples, the dielectric spacer 124 may be in contact with the interconnect structures 106, 1064, 1068, 118, 1014 and 1018.

In an embodiment, interconnect structures 1018, 1014, 1064 and 1068 include a material that is the same or substantially the same as the material of the interconnect structure 106 or 118. In an embodiment, metallization structure 1019, 1015, 1065 and 1069 include a material that is the same as the material of the metallization structure 120 or metallization structure 116.

In an illustrative embodiment, the NVM device 110 includes an MTJ device such as MTJ device 111 described in association with FIG. 9A or an RRAM device such as an RRAM device 111 described in association with FIG. 9B.

Referring again to FIG. 10, in an embodiment, the underlying substrate 108 represents a surface used to manufacture integrated circuits. In an embodiment, the substrate 108 includes a suitable semiconductor material such as but not limited to, single crystal silicon, polycrystalline silicon and silicon on insulator (SOI). In another embodiment, the substrate 108 includes other semiconductor materials, such as germanium, silicon germanium, or a suitable group III-V or group III-N compound. The substrate 108 may also include semiconductor materials, metals, dopants, and other materials commonly found in semiconductor substrates.

In an embodiment, the transistor 1001 and transistor 1050 are tri-gate transistors that are horizontally located on a same plane as illustrated in FIG. 10. The transistor 1001 and transistor 520 are electrically isolated by a dielectric layer 128 although they are formed on a common substrate 108.

In an embodiment, the transistor 100 includes a gate 1006 formed of at least two layers, a gate dielectric layer 1006A and a gate electrode layer 1006B on the gate dielectric layer 1006A. The gate dielectric layer 1006A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1006A to improve its quality when a high-k material is used.

The gate electrode layer 1006B of the transistor 1001 is formed on the gate dielectric layer 1006A and may consist of at least one P-type work function metal or N-type work function metal, depending on whether the transistor is to be a PMOS or an NMOS transistor. In some implementations, the gate electrode layer 1006B may consist of a stack of two or more metal layers, where one or more metal layers are work function metal layers and at least one metal layer is a conductive fill layer.

For a PMOS transistor, metals that may be used for the gate electrode layer 1006B include, but are not limited to, ruthenium, palladium, platinum, cobalt, nickel, and conductive metal oxides, e.g., ruthenium oxide. A P-type metal layer will enable the formation of a PMOS gate electrode layer 1006B with a work function that is between about 4.9 eV and about 5.2 eV. For an NMOS transistor, metals that may be used for the gate electrode layer 1006B include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode layer 1006B with a work function that is between about 3.9 eV and about 4.2 eV.

In some implementations, the gate electrode layer 1006B may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode layer 1006B may simply be a planar layer that is substantially parallel to the top surface of the substrate and does not include sidewall portions substantially perpendicular to the top surface of the substrate. In further implementations of the present disclosure, the gate electrode layer 1006B may consist of a combination of U-shaped structures and planar, non-U-shaped structures. For example, the gate electrode layer 1006B may consist of one or more U-shaped metal layers formed atop one or more planar, non-U-shaped layers.

In some implementations of the present disclosure, a pair of gate dielectric layer 1006A may be formed on opposing sides of the gate stack that bracket the gate stack. The gate dielectric layer 1006A may be formed from a material such as silicon nitride, silicon oxide, silicon carbide, silicon nitride doped with carbon, and silicon oxynitride. The transistor 1001 further includes a sidewall spacer 1072 adjacent to gate 1006. In an alternate implementation, sidewall spacer 1072 may include a plurality of spacer pairs, for instance, two pairs, three pairs, or four pairs of sidewall spacers may be formed on opposing sides of the gate 1006.

Source region 1004 and drain region 1002 are formed within the substrate 108 adjacent to the gate 1006 of the transistor 1001. The source region 1002 and drain region 1004 are generally formed using either an implantation/diffusion process or an etching/deposition process. In the former process, dopants such as boron, aluminum, antimony, phosphorous, or arsenic may be ion-implanted into the substrate to form the source region 1002 and drain region 1004. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 1002 and drain region 1004. In some implementations, the source region 1002 and drain region 1004 may be fabricated using a silicon alloy such as silicon germanium or silicon carbide. In some implementations the epitaxially deposited silicon alloy may be doped in-situ with dopants such as boron, arsenic, or phosphorous. In further embodiments, the source region source region 1002 and drain region 1004 may be formed using one or more alternate semiconductor materials such as germanium or a suitable group III-V compound. And in further embodiments, one or more layers of metal and/or metal alloys may be used to form the source region 1002 and drain region 1004.

In an embodiment, the second transistor 1050 is the same or substantially the same as 1001. In an embodiment, the gate 1056, source region 1054, drain region 1052 include one or more features of the gate 1006, source region 1002 and drain region 1004. The gate 1056 includes at least two layers, a gate dielectric layer 1056A and a gate electrode layer 1056B on the gate dielectric layer 1056A. The gate dielectric layer 1056A may include one layer or a stack of layers. The transistor 1050 further includes a sidewall spacer 1074 adjacent to gate 1056, as shown. In an alternate implementation, sidewall spacer 1074 may include a plurality of spacer pairs, for instance, two pairs, three pairs, or four pairs of sidewall spacers may be formed on opposing sides of the gate 1056.

In an embodiment, gate dielectric layer 1056A and the gate electrode 1056B include a material is that the same or substantially the same as the material of the gate dielectric layer 1006A and the gate electrode 1006B, respectively.

In an embodiment, the source contacts 1012 and 1062, drain contacts 1008 and 1058 and gate contacts 1010 and 1060 each include a multi-layer stack. In an embodiment, the multi-layer stack includes a liner layer of a material such as Ti, Ru or Al and a fill metal on the liner layer. The fill metal may include a material such as, Co, W or Ni.

In an embodiment, the isolation 1051 includes a material that is the same or substantially the same as the material of the dielectric 128.

Figure 11:
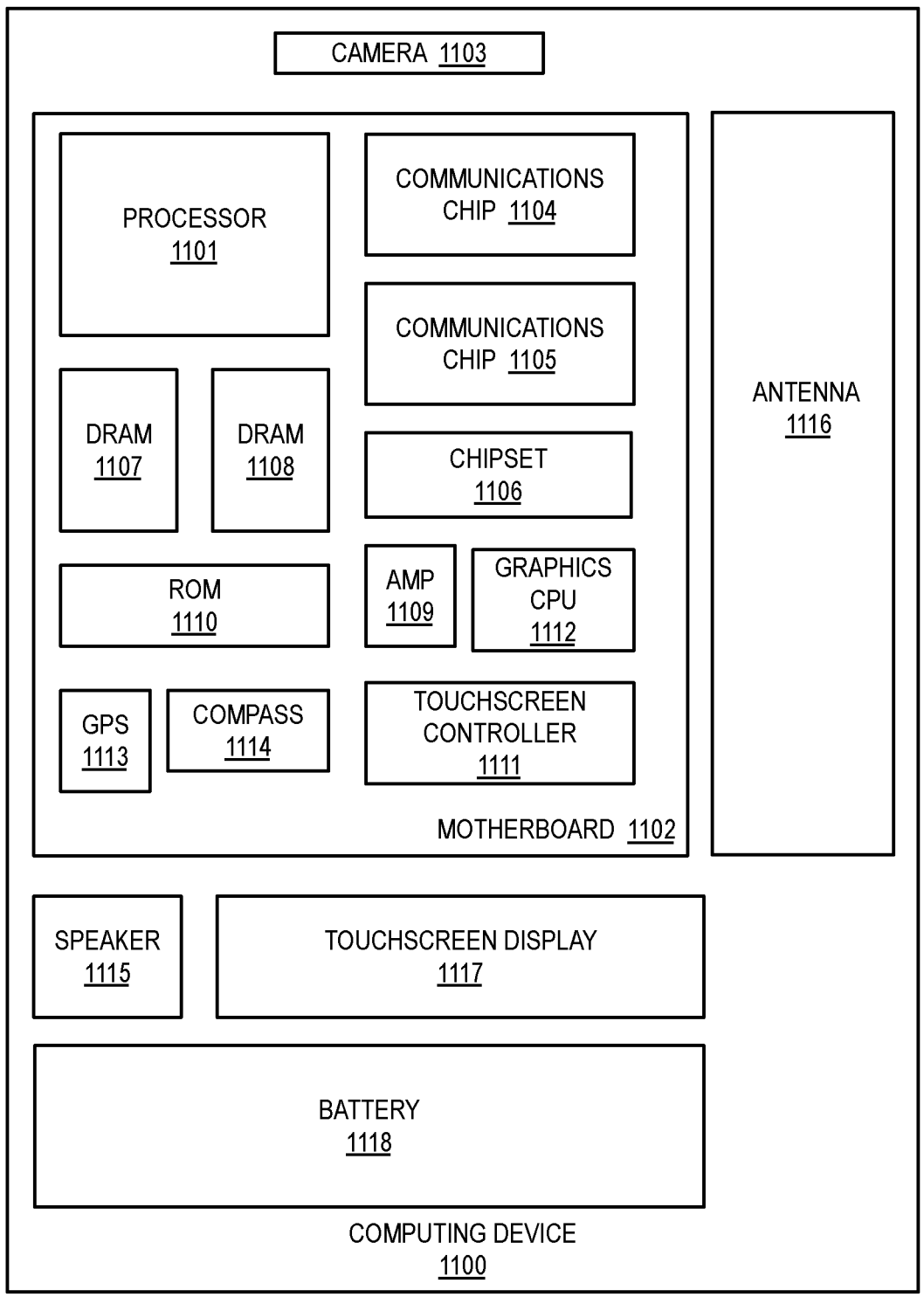
FIG. 11 illustrates a computing device in accordance with embodiments of the present disclosure.

FIG. 11 illustrates a computing device 1100 in accordance with embodiments of the present disclosure. As shown, computing device 1100 houses a motherboard 1102. Motherboard 1102 may include a number of components, including but not limited to a processor 1101 and at least one communications chip 1104 or 1105. Processor 1101 is physically and electrically coupled to the motherboard 1102. In some implementations, communications chip 1105 is also physically and electrically coupled to motherboard 1102. In further implementations, communications chip 1105 is part of processor 1101.

Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset 1106, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1105 enables wireless communications for the transfer of data to and from computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1105 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1100 may include a plurality of communications chips 1104 and 1105. For instance, a first communications chip 1105 may be dedicated to shorter range wireless communications such as Wi-Fi and Bluetooth and a second communications chip 1104 may be dedicated to longer range wireless communications such as GPS, EDGE, GPRS, CDMA, WiMAX, LTE, Ev-DO, and others.

Processor 1101 of the computing device 1100 includes an integrated circuit die packaged within processor 1101. In some embodiments, the integrated circuit die of processor 1101 includes one or more transistors, interconnect structures, non-volatile memory devices, conductive structures and metallization structures such as transistors 1001, 1050, interconnect structures 1018, 1014, 118, 106, 1064, 1068, non-volatile memory device 110, conductive structures 122, 1016, 1020, 1066 and 1070 and metallization structures 120, 1015, 1019, 1965 and 1969. The term "processor" may refer to any device or portion of a device that processes electronic data from registers and/or memory to transform that electronic data into other electronic data that may be stored in registers and/or memory.

Communications chip 1105 also includes an integrated circuit die packaged within communication chip 1105. In another embodiment, the integrated circuit die of communications chips 1104, 1105 includes one or more transistors, interconnect structures, non-volatile memory devices, conductive structures and metallization structures such as transistors 1001, 1050, interconnect structures 1018, 1014, 118, 106, 1064, 1068, non-volatile memory device 110, conductive structures 122, 1016, 1020, 1066 and 1070 and metallization structures 120, 1015, 1019, 1965 and 1969.

Depending on its applications, computing device 1100 may include other components that may or may not be physically and electrically coupled to motherboard 1102. These other components may include, but are not limited to, volatile memory (e.g., DRAM) 1107, 1108, non-volatile memory (e.g., ROM) 1110, a graphics CPU 1112, flash memory, global positioning system (GPS) device 1113, compass 1114, a chipset 1106, an antenna 1116, a power amplifier 1109, a touchscreen controller 1111, a touchscreen display 1117, a speaker 1115, a camera 1103, and a battery 1118, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1100 and discussed above may contain a stand-alone integrated circuit memory die that includes one or more arrays of NVM devices including one or more memory devices 110 coupled with metallization structures 116 and interconnect structures 106, and metallization structures 120 coupled with interconnect structure 118 with an intervening conductive structure 122.

In various implementations, the computing device 1100 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
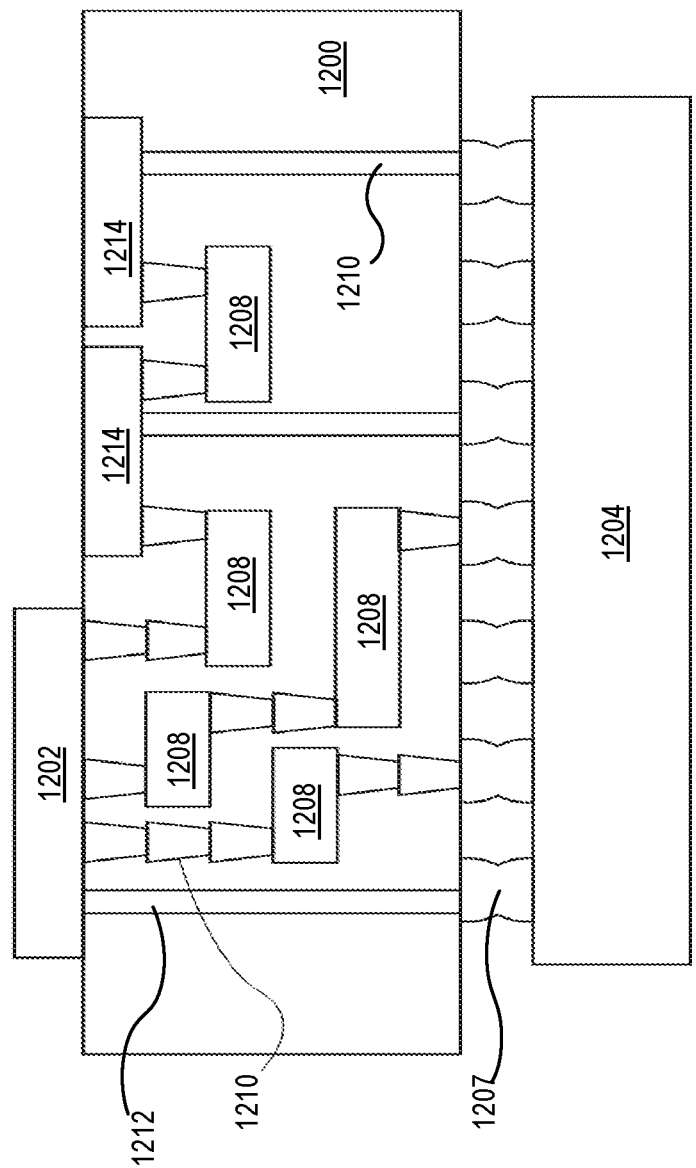
FIG. 12 illustrates an integrated circuit (IC) structure that includes one or more embodiments of the present disclosure.

FIG. 12 illustrates an integrated circuit (IC) structure 1200 that includes one or more embodiments of the disclosure. The integrated circuit (IC) structure 1200 is an intervening substrate used to bridge a first substrate 1202 to a second substrate 1204. The first substrate 1202 may be, for instance, an integrated circuit die. The second substrate 1204 may be, for instance, a memory module, a computer mother, or another integrated circuit die. Generally, the purpose of an integrated circuit (IC) structure 1200 is to spread a connection to a wider pitch or to reroute a connection to a different connection. For example, an integrated circuit (IC) structure 1200 may couple an integrated circuit die to a ball grid array (BGA) 1207 that can subsequently be coupled to the second substrate 1204. In some embodiments, the first and second substrates 1202/1204 are attached to opposing sides of the integrated circuit (IC) structure 1200. In other embodiments, the first and second substrates 1202/1204 are attached to the same side of the integrated circuit (IC) structure 1200. And in further embodiments, three or more substrates are interconnected by way of the integrated circuit (IC) structure 1200.

The integrated circuit (IC) structure 1200 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1208 and vias 1210, including but not limited to through-silicon vias (TSVs) 1212. The integrated circuit (IC) structure 1200 may further include embedded devices 1214, including both passive and active devices. Such devices include, but are not limited to, capacitors, decoupling capacitors, resistors, inductors, fuses, diodes, transformers, device structure including transistors, such as transistors 1050 (described in FIG. 10) coupled with a with one at least one nonvolatile memory device such as the NVM device 110 having a conductive electrode 112 coupled with a metallization structure 116, in accordance with an embodiment of the present disclosure. In one embodiment, embedded devices 1214 may include logic transistor such as logic transistor 1001 (FIG. 10) where the logic transistor is coupled with an interconnect structure 118, metallization structure 120 and an intervening conductive structure 122 between the interconnect structure 118 and the metallization structure 120. The integrated circuit (IC) structure 1200 may further include embedded devices 1214 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 1200. In accordance with embodiments of the present disclosure, apparatuses or processes disclosed herein may be used in the fabrication of integrated circuit (IC) structure 1200.

Accordingly, one or more embodiments of the present disclosure relate generally to the fabrication of interconnect and metallization structures for logic and microelectronic memory devices. The microelectronic memory may be non-volatile, wherein the memory can retain stored information even when not powered. One or more embodiments of the present disclosure relate to the fabrication of a metallization structure adjacent to a conductive structure such as the conductive structure 122. In some embodiments, conductive structure 122 may be used in both memory and in logic regions.

Thus, embodiments of the present disclosure include interconnect and metallization structures for logic and memory devices and methods of fabrication.

In a first example, an apparatus includes a first interconnect structure above a substrate, a memory device above and coupled with the first interconnect structure, where the memory device includes an electrode. The apparatus further includes a first structure on a portion of the electrode, where the first structure includes metal, a second interconnect structure above the substrate, where the second interconnect structure is laterally distant from the first interconnect structure. The apparatus further includes a second structure above the second interconnect structure, where the second structure includes metal, and where the second structure is separated from the memory device by a dielectric. The apparatus further includes a third structure between the second structure and the second interconnect structure, where the third structure includes conductive material and the apparatus also includes a dielectric spacer adjacent to the memory device, wherein the dielectric spacer extends from the memory device to the third structure.

In second examples, for any of first examples, the first structure includes a liner layer and a fill metal, and the second structure includes the liner layer and the fill metal, where the liner layer includes ruthenium, cobalt or tantalum, and where the fill metal includes copper or tungsten.

In third examples, for any of the first through second examples, third structure has a first portion on the second interconnect structure and a second portion adjacent to the dielectric spacer.

In fourth examples, for any of the first through third examples, the first portion has a thickness as measured vertically upward from an upper surface of the second interconnect structure, and where the thickness is between 2 nm and 5 nm.

In fifth examples, for any of the first through fourth examples, the second portion has a thickness as measured laterally from the dielectric, and where the thickness is between 1 nm and 3 nm.

In sixth examples, for any of the first through fifth examples, the first portion has a thickness, as measured vertically upward from an upper surface of the second interconnect structure, and where the thickness is non-uniform.

In seventh examples, for any of the first through sixth examples, the third structure includes one or more of ruthenium, titanium or tantalum.

In eighth examples, for any of the first through seventh examples, the third structure includes trace amount of oxygen.

In ninth examples, for any of the first through eighth examples, the second structure has a first portion and a second portion, where the third structure is between the first portion of the second structure and the dielectric, and where the second portion is adjacent to the dielectric spacer.

In tenth examples, for any of the first through ninth examples, the electrode further includes a first electrode portion including a metal and a second electrode portion in contact with the first portion, where the second electrode portion includes the metal and oxygen, and where the first structure is in contact with the first electrode portion and the second electrode portion.

In eleventh examples, for any of the first through tenth examples, a section of the second electrode portion extends along a sidewall of the first electrode portion.

In twelfth examples, for any of the first through eleventh examples, the first structure has a lateral dimension that is greater than a lateral dimension of the electrode.

In thirteenth examples, an apparatus includes a first interconnect structure above a substrate and a memory device above and adjacent to the first interconnect structure. The memory device includes a non-volatile memory element on the first interconnect structure and an electrode on the non-volatile memory element, where the electrode has a first electrode portion and a second electrode portion on the first electrode portion. The apparatus further includes a first metallization structure adjacent to the first electrode portion, a second interconnect structure above the substrate, where the second interconnect structure is laterally distant from the first interconnect structure. The apparatus further includes a second metallization structure coupled to the second interconnect structure, where the second interconnect structure is separated from the memory device by a dielectric. The apparatus further includes a conductive material between the second metallization structure and the second interconnect structure, where the conductive material is absent between the electrode and the first metallization structure. The apparatus further includes a dielectric spacer adjacent to the memory device, where the dielectric spacer extends from the memory device to the conductive structure.

In a fourteenth example, for any of the thirteenth examples, the first electrode portion includes a metal and the second electrode portion includes the metal and oxygen.

In fifteenth examples, for any of the thirteenth through fourteenth examples, the first metallization structure is in contact with the first electrode portion and the second electrode portion.

In sixteenth examples, for any of the fourteenth through fifteenth examples, a section of the second electrode portion extends along a sidewall of the first electrode portion.

In seventeenth examples, for any of the fourteenth through sixteenth examples, the conductive structure includes one or more of ruthenium, titanium or tantalum.

In eighteenth examples, a system includes a processor including a first transistor in a first region above a substrate, where the first transistor includes a first interconnect structure coupled to a first drain, a second interconnect structure coupled to a first source and a third interconnect structure coupled to a first gate. A non-volatile memory (NVM) device is coupled with the first interconnect structure, the NVM device includes a non-volatile memory element and an electrode on the non-volatile memory element. The system further includes a first metallization structure adjacent to the first electrode portion, a second interconnect structure above the substrate, where the second interconnect structure is laterally distant from the first interconnect structure. The system further includes a second metallization structure coupled to the second interconnect structure, where the second interconnect structure is separated from the memory device by a dielectric. The system further includes a conductive material between the second metallization structure and the second interconnect structure, where the conductive material is absent between the electrode and the first metallization structure. The system further includes a dielectric spacer adjacent to the memory device, where the dielectric spacer extends from the memory device to the conductive structure.

In nineteenth examples, for any of the eighteenth examples, the conductive structure includes one or more of ruthenium, titanium or tantalum.

In twentieth example, for any of the eighteenth examples through nineteenth examples, the conductive structure is a first conductive structure and the system further includes: a second conductive structure between the third interconnect structure and a third metallization structure in the first region.

What is claimed is:

1. An apparatus, comprising:
   a first interconnect structure above a substrate;
   a memory device above and coupled with the first interconnect structure, the memory device comprising an electrode;
   a first structure on a portion of the electrode, wherein the first structure comprises metal;
   a second interconnect structure above the substrate, the second interconnect structure laterally distant from the first interconnect structure;
   a second structure above the second interconnect structure, wherein the second structure comprises metal, and wherein the second structure is separated from the memory device by a dielectric;
   a third structure between the second structure and the second interconnect structure, wherein the third structure comprises conductive material; and
   a dielectric spacer adjacent to the memory device, wherein the dielectric spacer extends from the memory device to the third structure.

2. The apparatus of claim 1, wherein the first structure includes a liner layer and a fill metal, and the second structure includes the liner layer and the fill metal, wherein the liner layer includes ruthenium, cobalt or tantalum, and wherein the fill metal includes copper or tungsten.

3. The apparatus of claim 1, wherein the third structure has a first portion on the second interconnect structure and a second portion adjacent to the dielectric spacer.

4. The apparatus of claim 3, wherein the first portion has a thickness as measured vertically upward from an upper surface of the second interconnect structure, and wherein the thickness is between 2 nm and 5 nm.

5. The apparatus of claim 3, wherein the second portion has a thickness as measured laterally from the dielectric, and wherein the thickness is between 1 nm and 3 nm.

6. The apparatus of claim 3, wherein the first portion has a thickness, as measured vertically upward from an upper surface of the second interconnect structure, and wherein the thickness is non-uniform.

7. The apparatus of claim 1, wherein the third structure includes one or more of ruthenium, titanium or tantalum.

8. The apparatus of claim 7, wherein the third structure includes trace amount of oxygen.

9. The apparatus of claim 1, wherein the second structure has a first portion and a second portion, wherein the third structure is between the first portion of the second structure and the dielectric, and wherein the second portion is adjacent to the dielectric spacer.

10. The apparatus of claim 1, wherein the electrode further comprises:
    a first electrode portion comprising a metal; and
    a second electrode portion in contact with the first portion, wherein the second electrode portion comprises the metal and oxygen, and wherein the first structure is in contact with the first electrode portion and the second electrode portion.

11. The apparatus of claim 10, wherein a section of the second electrode portion extends along a sidewall of the first electrode portion.

12. The apparatus of claim 1, wherein the first structure has a lateral dimension that is greater than a lateral dimension of the electrode.

13. An apparatus, comprising:
    a first interconnect structure above a substrate;
    a memory device above and adjacent to the first interconnect structure, the memory device comprising:
       a non-volatile memory element on the first interconnect structure; and an electrode on the non-volatile memory element, wherein the electrode has a first electrode portion and a second electrode portion on the first electrode portion;

a first metallization structure adjacent to the first electrode portion;

a second interconnect structure above the substrate, wherein the second interconnect structure is laterally distant from the first interconnect structure;

a second metallization structure coupled to the second interconnect structure, the second interconnect structure separated from the memory device by a dielectric;

a conductive material between the second metallization structure and the second interconnect structure, wherein the conductive material is absent between the electrode and the first metallization structure; and a dielectric spacer adjacent to the memory device, wherein the dielectric spacer extends from the memory device to the conductive structure.

14. The apparatus of claim 13, wherein the first electrode portion comprises a metal and the second electrode portion comprises the metal and oxygen.

15. The apparatus of claim 13, wherein the first metallization structure is in contact with the first electrode portion and the second electrode portion.

16. The apparatus of claim 13, wherein a section of the second electrode portion extends along a sidewall of the first electrode portion.

17. The apparatus of claim 13, wherein the conductive structure includes one or more of ruthenium, titanium or tantalum.

18. A system comprising:
a processor comprising a first transistor in a first region above a substrate, the first transistor comprising:
a first interconnect structure coupled to a first drain;
a second interconnect structure coupled to a first source; and
a third interconnect structure coupled to a first gate;
a non-volatile memory (NVM) device coupled with the first interconnect structure, the NVM device comprising:
a non-volatile memory element; and
an electrode on the non-volatile memory element;
a first metallization structure on a portion of the electrode;
the processor comprising a second transistor in a second region above the substrate, the second transistor comprising:
a fourth interconnect structure coupled to a second drain;
a fifth interconnect structure coupled to a second source; and
a sixth interconnect structure coupled to a second gate;
a second metallization structure above the fourth interconnect structure, the second metallization structure separated from the memory device by a dielectric;
a conductive structure between the second metallization structure and the fourth interconnect structure; and
a dielectric spacer adjacent to the memory device, wherein the dielectric spacer extends from the memory device to the conductive structure.

19. The system of claim 18, wherein the conductive structure includes one or more of ruthenium, titanium or tantalum.

20. The system of claim 18, wherein the conductive structure is a first conductive structure and the system further comprises: a second conductive structure between the third interconnect structure and a third metallization structure in the first region.

* * * * *